(12) United States Patent
Cho et al.

(10) Patent No.: US 10,211,089 B2
(45) Date of Patent: Feb. 19, 2019

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Moon Gi Cho, Anyang-si (KR); Byungju Kang, Seoul (KR); Janie Hyojin Kim, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/619,648

(22) Filed: Jun. 12, 2017

(65) Prior Publication Data

US 2018/0082890 A1    Mar. 22, 2018

(30) Foreign Application Priority Data

Sep. 22, 2016 (KR) .................. 10-2016-0121634

(51) Int. Cl.
| | |
|---|---|
| *H01L 21/768* | (2006.01) |
| *H01L 21/8234* | (2006.01) |
| *H01L 23/522* | (2006.01) |
| *H01L 23/528* | (2006.01) |
| *H01L 27/06* | (2006.01) |
| *H01L 21/02* | (2006.01) |

(52) U.S. Cl.
CPC .. *H01L 21/76816* (2013.01); *H01L 21/02107* (2013.01); *H01L 21/76877* (2013.01); *H01L 21/823475* (2013.01); *H01L 23/528* (2013.01); *H01L 23/5223* (2013.01); *H01L 27/0629* (2013.01)

(58) Field of Classification Search
CPC .................. H01L 27/108; H01L 28/40; H01L 2924/1436
See application file for complete search history.

(56) References Cited

U.S. PATENT DOCUMENTS

| | | |
|---|---|---|
| 7,662,695 B2 | 2/2010 | Choi |
| 7,859,825 B2 | 12/2010 | Kim et al. |
| 8,856,715 B1 | 10/2014 | Stephens et al. |
| 8,963,332 B2 | 2/2015 | Kim et al. |

(Continued)

FOREIGN PATENT DOCUMENTS

| | | |
|---|---|---|
| JP | 2014063901 A | 4/2014 |
| KR | 2011-0060723 A | 6/2011 |
| KR | 2011-0083978 A | 7/2011 |

*Primary Examiner* — Walter H Swanson
(74) *Attorney, Agent, or Firm* — Lee & Morse, P.C.

(57) ABSTRACT

A semiconductor device and a fabricating method thereof are provided. The method includes sequentially forming an interlayer insulating layer and a hard mask layer on a substrate with first and second regions, performing a first patterning process on the hard mask layer to form first openings in the first and second regions, performing a second patterning process on the hard mask layer to form second openings in the first and second regions, and performing a third patterning process on the hard mask layer to selectively form at least one third opening in only the second region. The third patterning process includes forming a first photoresist pattern with openings on the hard mask layer, and the opening of the first photoresist pattern on the first region is overlapped with the second opening on the first region, when viewed in a plan view.

19 Claims, 33 Drawing Sheets

(56) References Cited

U.S. PATENT DOCUMENTS

| | | |
|---|---|---|
| 9,279,191 B2 | 3/2016 | Kawanishi |
| 9,633,999 B1 * | 4/2017 | Lu .......................... H01L 27/088 |
| 2015/0022948 A1 | 1/2015 | An et al. |
| 2016/0268200 A1 * | 9/2016 | Ishikura .............. H01L 23/5283 |

* cited by examiner

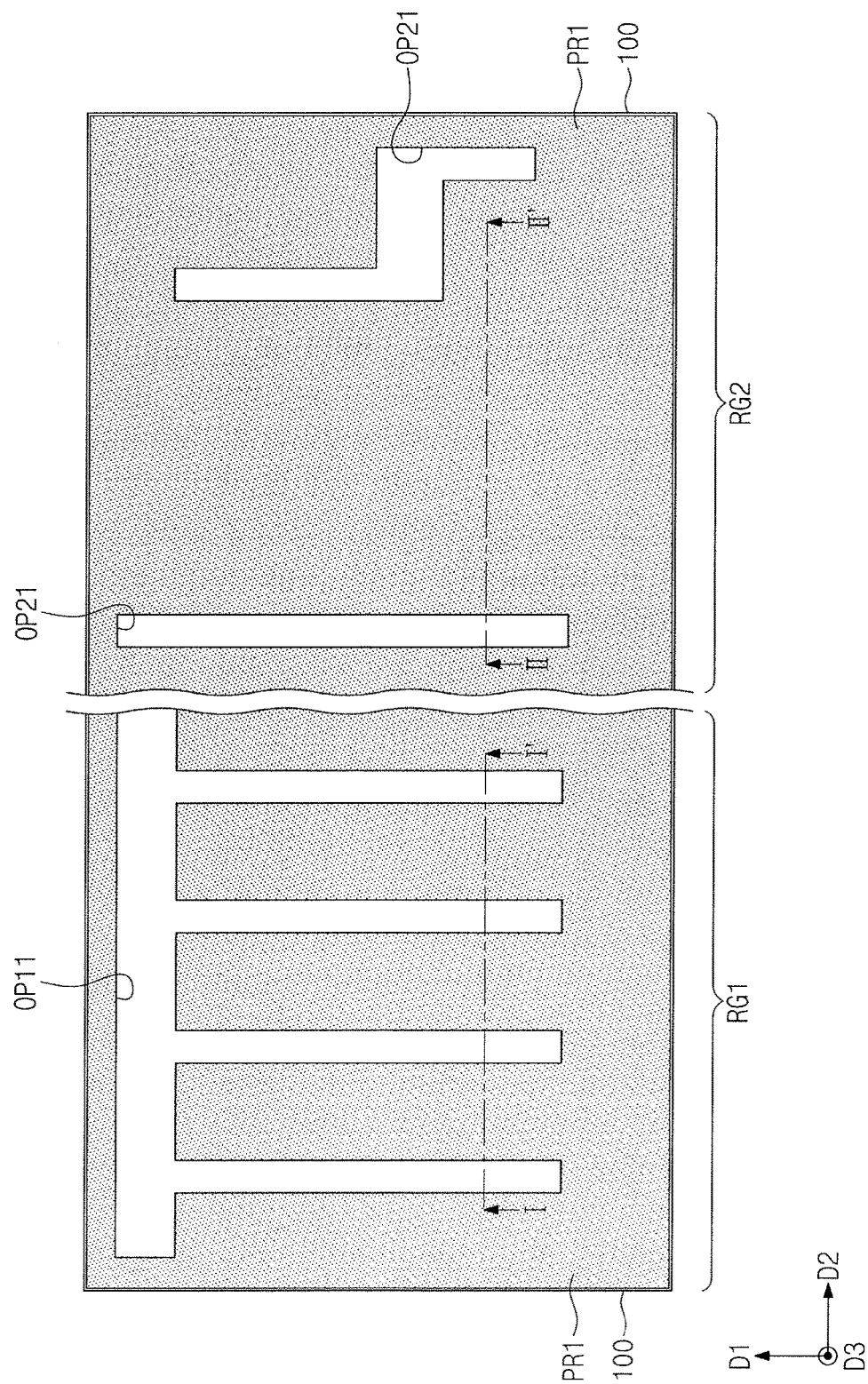

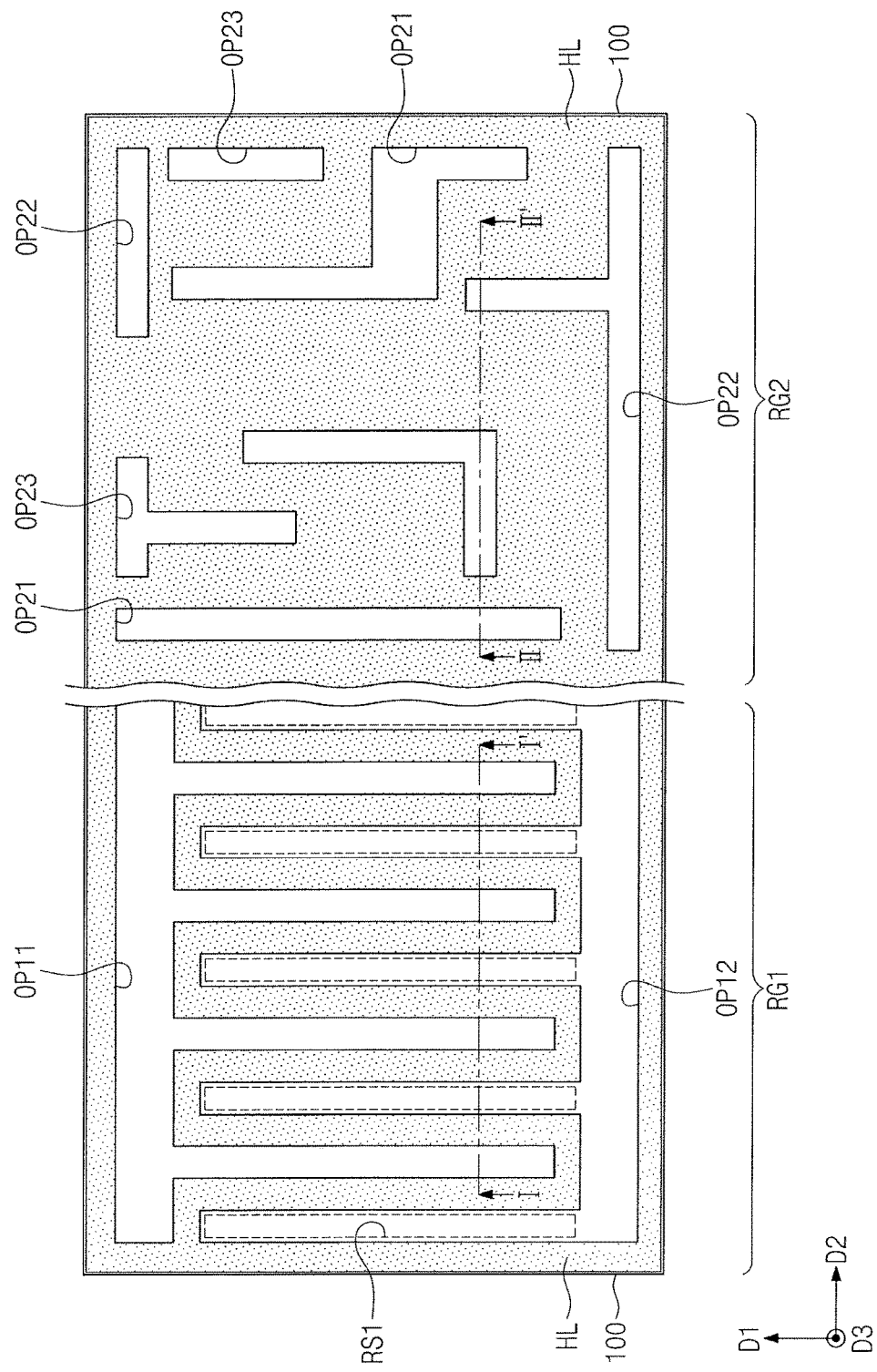

SEMICONDUCTOR DEVICE AND METHOD OF FABRICATING THE SAME

CROSS-REFERENCE TO RELATED APPLICATION

Korean Patent Application No. 10-2016-0121634, filed on Sep. 22, 2016, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

Due to their small-size, multifunctionality, and/or low-cost characteristics, semiconductor devices are desirable elements in the electronic industry. Generally, the semiconductor devices are classified into a memory device for storing data, a logic device for processing data, and a hybrid device for performing various functions.

As the electronic industry advances, there is an increasing demand for a semiconductor device with a higher integration density and higher performance. To meet such a demand, it is desirable to reduce a process margin (for example, in a photolithography process). The reduction of the process margin may lead to several difficulties in fabricating a semiconductor device. Accordingly, various researches are conducted to satisfy the above demands.

SUMMARY

Embodiments are directed to a method of fabricating a semiconductor device, which may include sequentially forming an interlayer insulating layer and a hard mask layer on a substrate having a first region and a second region, performing a first patterning process on the hard mask layer to form first openings in the first and second regions, performing a second patterning process on the hard mask layer to form second openings in the first and second regions, and performing a third patterning process on the hard mask layer to selectively form at least one third opening in only the second region. The third patterning process may include forming a first photoresist pattern with openings on the hard mask layer, and the opening of the first photoresist pattern on the first region may be overlapped with the second opening on the first region, when viewed in a plan view.

Embodiments are also directed to a semiconductor device, which may include a substrate having a first region and a second region, transistors provided on the substrate, an interlayer insulating layer covering the transistors, first conductive wiring patterns provided on the first region and in an upper portion of the interlayer insulating layer, and second conductive wiring patterns provided in the second region and in the upper portion of the interlayer insulating layer. The first conductive wiring patterns may include a first wire having a protruding portion extending toward the substrate, and a level of a bottom surface of the protruding portion may be different from a level of a bottom surface of each of the second conductive wiring patterns.

Embodiments are also directed to a semiconductor device, including a substrate having a first region and a second region, transistors provided on the substrate in the first and second regions, an interlayer insulating layer covering the transistors in the first and second regions, first conductive wiring patterns provided in the first region in an upper portion of the interlayer insulating layer, and second conductive wiring patterns provided in the second region in the upper portion of the interlayer insulating layer. The first conductive wiring patterns may include a first wire having a bottom portion and a protruding portion that extends from the bottom portion toward the substrate, and the second conductive wiring patterns may include a first wiring pattern having a bottom portion that is level with the bottom portion of the first wire.

BRIEF DESCRIPTION OF THE DRAWINGS

Features will become apparent to those of skill in the art by describing in detail exemplary embodiments with reference to the attached drawings in which:

FIGS. 8A, 9A, 10A, 11A, 12A, 13A, 14A, and 15A illustrate plan views illustrating a method of fabricating a semiconductor device, according to some embodiments.

FIGS. 18A, 19A, 20A, and 21A illustrate plan views illustrating a method of fabricating a semiconductor device, according to some embodiments.

DETAILED DESCRIPTION

Figure 1:
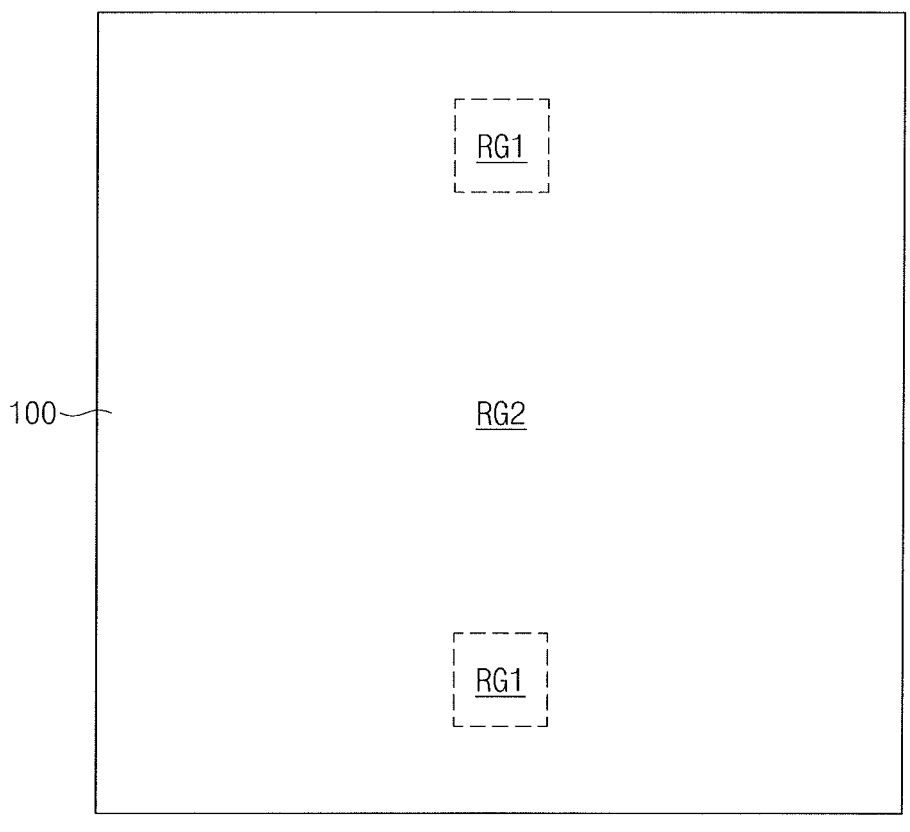
FIG. 1 illustrates a plan view of a semiconductor device according to some embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
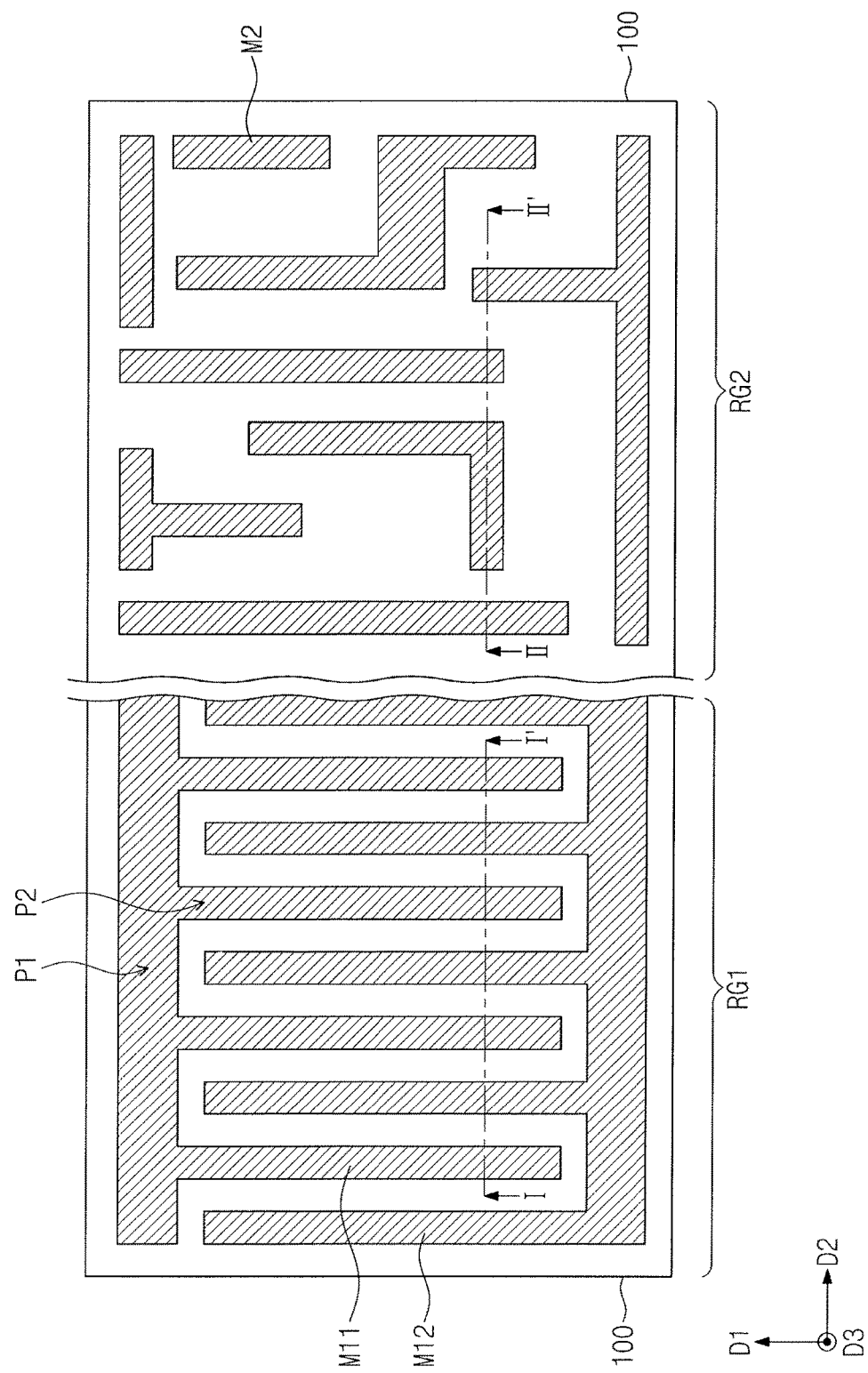
FIG. 2 illustrates a plan view of portions of first and second regions of FIG. 1.
Figure 3:
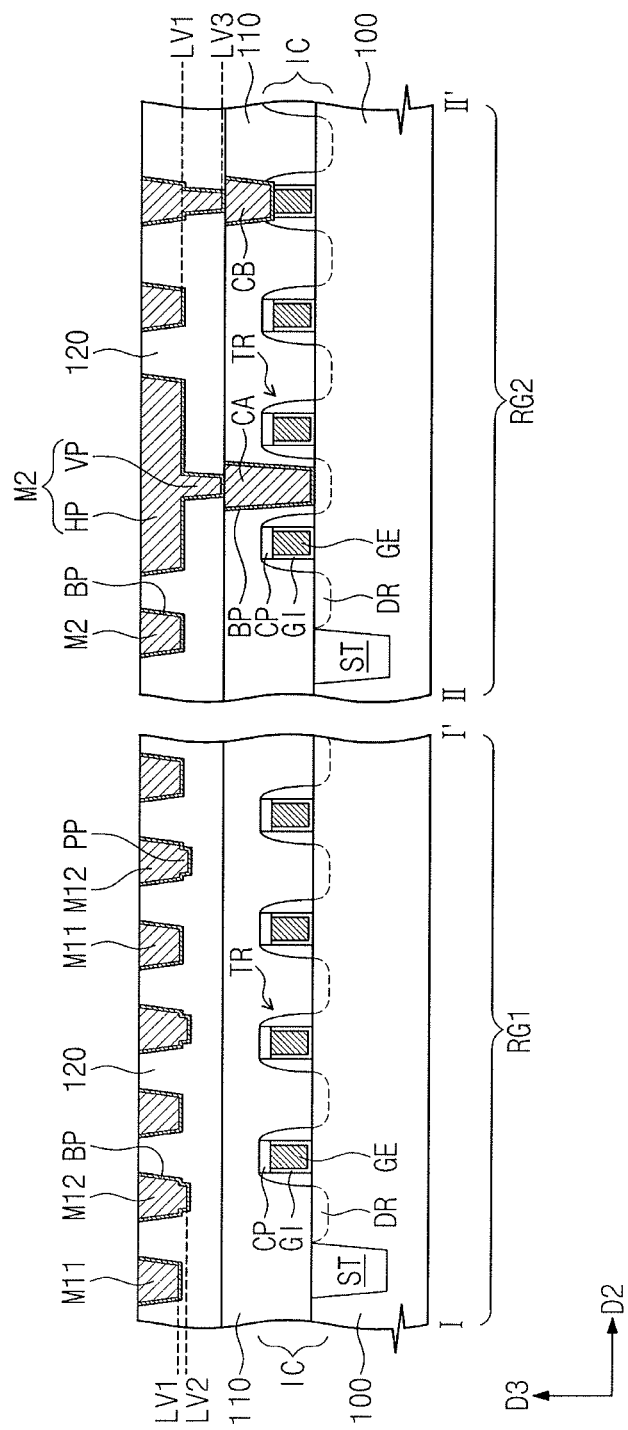
FIG. 3 illustrates a sectional view taken along lines I-I' and II-II' of FIG. 2.
Figure 4:
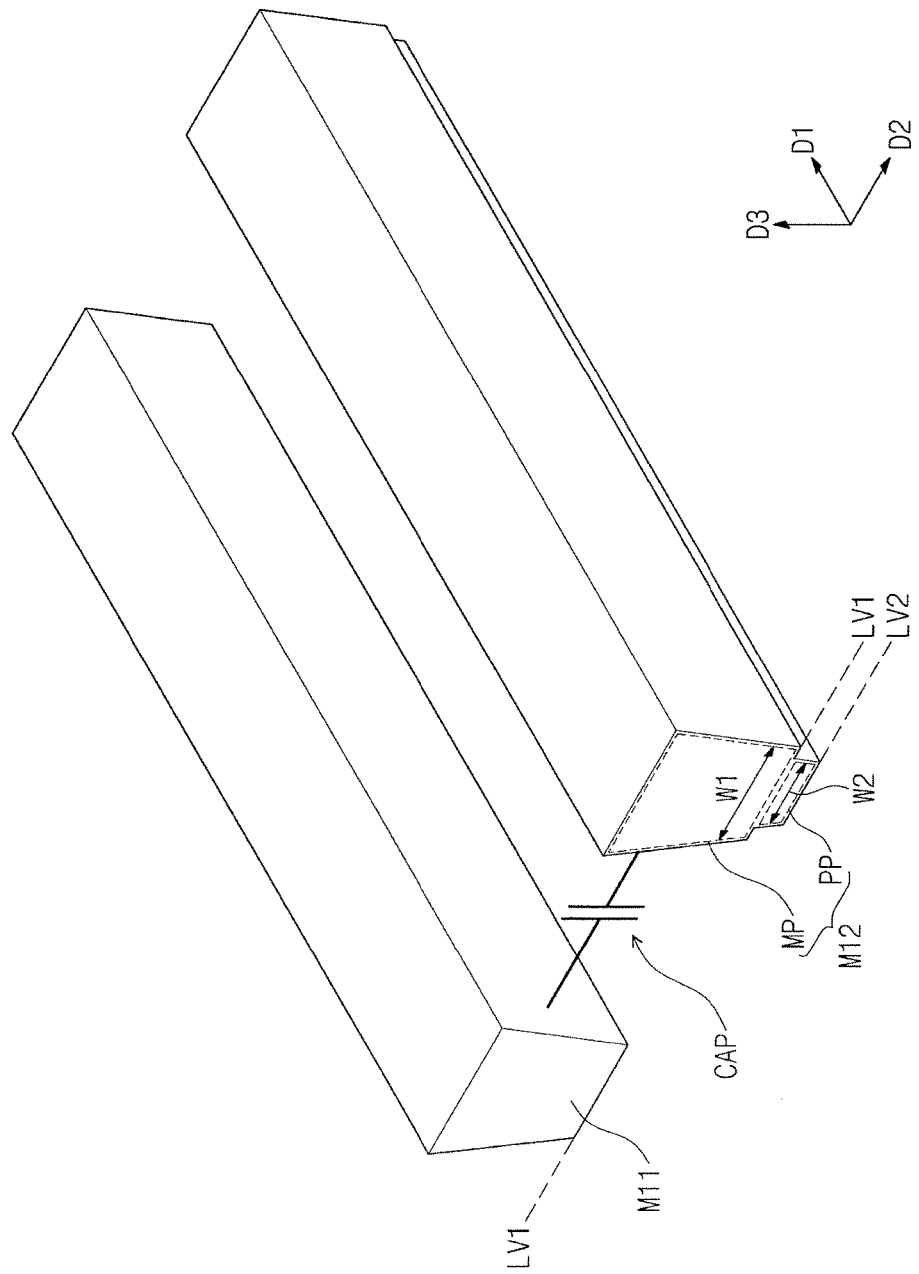
FIG. 4 illustrates a perspective view of first and second wires shown in FIGS. 2 and 3.

FIG. 1 is a plan view of a semiconductor device according to some embodiments. FIG. 2 is a plan view of portions of first and second regions of FIG. 1. FIG. 3 is a sectional view taken along lines I-I' and II-II' of FIG. 2. FIG. 4 is a perspective view of first and second wires shown in FIGS. 2 and 3.

Referring to FIGS. 1 to 4, a substrate 100 including first regions RG1 and a second region RG2 may be provided. The substrate 100 shown in FIG. 1 may be a portion of a wafer corresponding to a single semiconductor chip. The second region RG2 may be the remaining region of the substrate 100 except for the first regions RG1. The first regions RG1 may be spaced apart from each other. In some embodiments, at least two first regions RG1 may be provided on the substrate 100. However, in certain embodiments, the number of the first regions RG1 may be greater than or equal to three or may be one.

A capacitor may be provided on each of the first regions RG1, as will be described below. The capacitor may include or consist of an interlayer insulating layer and conductive wiring patterns. As an example, the capacitor may be a vertical native capacitor (VNCAP).

Referring back to FIGS. 2 to 4, an integrated circuit IC may be disposed on the first and second regions RG1 and RG2 of the substrate 100. The substrate 100 may be, for example, a silicon wafer, a germanium wafer, or a silicon-germanium wafer. As an example, the integrated circuit IC may include logic cells for processing data and a control and/or power circuit for controlling operations of the logic cells. An another example, the integrated circuit IC may include memory cells for storing data and a control and/or power circuit for controlling operations of the memory cells.

The integrated circuit IC may include a plurality of transistors TR. Device isolation layers ST may be formed in the substrate 100 to define an active region, and the transistors TR may be formed on the active region. The transistors TR may be used to constitute the logic cells or the memory cells.

Each of the transistors TR may include, for example, a gate electrode GE, a gate dielectric layer GI, which is interposed between the gate electrode GE and the substrate 100, a capping pattern CP, which is provided to cover a top surface of the gate electrode GE, and impurity regions DR, which are provided at both sides of the gate electrode GE. The impurity regions DR may be, for example, doped regions formed in the substrate 100. The gate electrode GE may be a line-shaped structure that extends in a first direction D1 parallel to a top surface of the substrate 100. Furthermore, the device isolation layers ST formed in the substrate 100 may be adjacent to the transistors TR.

According to some embodiments, the active region may include a plurality of active fins. The active fins may extend in a second direction D2 crossing the first direction D1. Here, the gate electrode GE may be provided to cross the active fins and to extend in the first direction D1.

A first interlayer insulating layer 110 and a second interlayer insulating layer 120 may be sequentially stacked on the first and second regions RG1 and RG2 of the substrate 100. The first interlayer insulating layer 110 may cover the transistors TR. The first and second interlayer insulating layers 110 and 120 may be formed of or include, for example, a silicon oxide layer or a silicon oxynitride layer.

A first contact CA and a second contact CB may be provided in the second region RG2 and in the first interlayer insulating layer 110. Each of the first and second contacts CA and CB may extend from a top surface of the first interlayer insulating layer 110 toward the substrate 100. The first contact CA may be electrically coupled to at least one of the impurity regions DR, and the second contact CB may be electrically coupled to at least one of the gate electrode GE. The first contact CA and the second contact CB may be formed of or include a metallic material (e.g., copper (Cu) or tungsten (W)). Furthermore, each of the first and second contacts CA and CB may be provided in plural. The first and second contacts CA and CB may also be provided on the first region RG1.

Barrier patterns BP may be respectively interposed between the first and second contacts CA and CB and the first interlayer insulating layer 110. Each of the barrier patterns BP may be provided to directly cover side and bottom surfaces of each of the first and second contacts CA and CB. The barrier patterns BP may prevent a metallic material contained in the first and second contacts CA and CB from being diffused into the first interlayer insulating layer 110. As an example, the barrier patterns BP may be formed of or include at least one of Ti or TiN.

First conductive wiring patterns M11 and M12 may be provided on the first region RG1 and in the second interlayer insulating layer 120. Second conductive wiring patterns M2 may be provided in the second region RG2 and in the second interlayer insulating layer 120. As an example, the first and second conductive wiring patterns M11, M12, and M2 may be formed of or include a metallic material (e.g., copper (Cu) or tungsten (W)).

The second conductive wiring patterns M2 may extend in the first direction D1 or in the second direction D2. The second conductive wiring patterns M2 may be provided to have at least two different widths. Thus, planar shapes of the second conductive wiring patterns M2 may be variously changed. The second conductive wiring patterns M2 may have top surfaces coplanar with that of the second interlayer insulating layer 120. At least one of the second conductive wiring patterns M2 may include a horizontally extended portion HP and a vertically extended portion VP. The vertically extended portion VP may extend toward the substrate 100 and may be electrically coupled to the first contact CA or the second contact CB.

The barrier patterns BP may be respectively interposed between the first and second conductive wiring patterns M11, M12, and M2 and the second interlayer insulating layer 120. Each of the barrier patterns BP may be provided to directly cover side and bottom surfaces of each of the first and second conductive wiring patterns M11, M12, and M2. The barrier patterns BP may prevent a metallic material contained in the first and second conductive wiring patterns M11, M12, and M2 from being diffused into the second interlayer insulating layer 120. As an example, the barrier patterns BP may be formed of or include at least one of Ti or TiN.

The first conductive wiring patterns M11 and M12 may include a first wire M11 and a second wire M12. The first wire M11 and the second wire M12 may be spaced apart from each other. Each of the first and second wires M11 and M12 may include a first portion P1 extending in the second direction D2 and a plurality of second portions P2 extending in the first direction D1. Hereinafter, the second portions P2 of the first wire M11 may be referred to as 'first wires M11', and the second portions P2 of the second wire M12 may be referred to as 'second wires M12'.

Referring back to FIGS. 3 and 4, each of the first wires M11 and the second wires M12 may be a line-shaped structure extending in the first direction D1. The first and second wires M11 and M12 may be alternatingly disposed in the second direction D2. Each of the first and second wires M11 and M12 may have a structure in which width in the second direction D2 increases with increasing distance from the substrate 100. The first and second wires M11 and M12 may have top surfaces coplanar with that of the second interlayer insulating layer 120. The first and second wires M11 and M12 may have bottom surfaces that are higher than a bottom surface of the second interlayer insulating layer 120.

Each of the second wires M12 may include a main portion MP and a protruding portion PP thereunder, as shown in FIG. 4. The protruding portion PP may extend vertically toward the substrate 100. A lower portion of the main portion MP may have a first width W1, and an upper portion of the protruding portion PP may have a second width W2. Here, the first width W1 may be greater than the second width W2. The second wire M12 may have a stepwise sidewall profile near an interface between the main and protruding portions MP and PP. Thus, the width of the second wire M12 may be abruptly changed at the interface between the main and protruding portions MP and PP.

The bottom surfaces of the first wires M11 may be positioned at a first level LV1. In the present specification, the term 'level' may be a height that is measured from a top surface of the substrate 100. Bottom surfaces of the main portions MP of the second wires M12 may be positioned at the first level LV1. Thus, the bottom surfaces of the first wires M11 may be positioned at substantially the same height as those of the main portions MP. Bottom surfaces of the protruding portions PP of the second wires M12 may be positioned at a second level LV2. The second level LV2 may be lower than the first level LV1, that is, closer to the substrate 100.

The bottom surfaces of the second conductive wiring patterns M2 other than the vertically extended portion VP may be positioned at the first level LV1. Furthermore, a bottom surface of the horizontally extended portion HP of the second conductive wiring pattern M2 may be positioned at the first level LV1. A bottom surface of the vertically extended portion VP of the second conductive wiring pattern M2 may be positioned at a third level LV3. Here, the second level LV2 may be lower than the first level LV1 and may be higher than the third level LV3. Thus, the level LV2, at which the bottom surfaces of the protruding portions PP of the second wires M12 are positioned, may be different from the level LV1 or LV3, at which the bottom surfaces of the second conductive wiring patterns M2 are positioned.

The first wire M11, the second wire M12, and the second interlayer insulating layer 120 therebetween may constitute a capacitor CAP. In the case where there is a difference in electric potential between the first wire M11 and the second wire M12, electric charges may be stored in the capacitor CAP.

The first and second conductive wiring patterns M11, M12, and M2 described above may constitute a first metal layer of a semiconductor device according to some embodiments. The second conductive wiring patterns M2 in the second region RG2 may be used as a routing line of the integrated circuit IC. Furthermore, at least one metal layer may be additionally stacked on the first metal layer. For example, a second metal layer including conductive wiring patterns may be provided on the first metal layer. At least one metal layer may be additionally interposed between the second metal layer and the first interlayer insulating layer 110. For example, a third metal layer including conductive wiring patterns may be interposed between the first metal layer and the first interlayer insulating layer 110.

Figure 5:
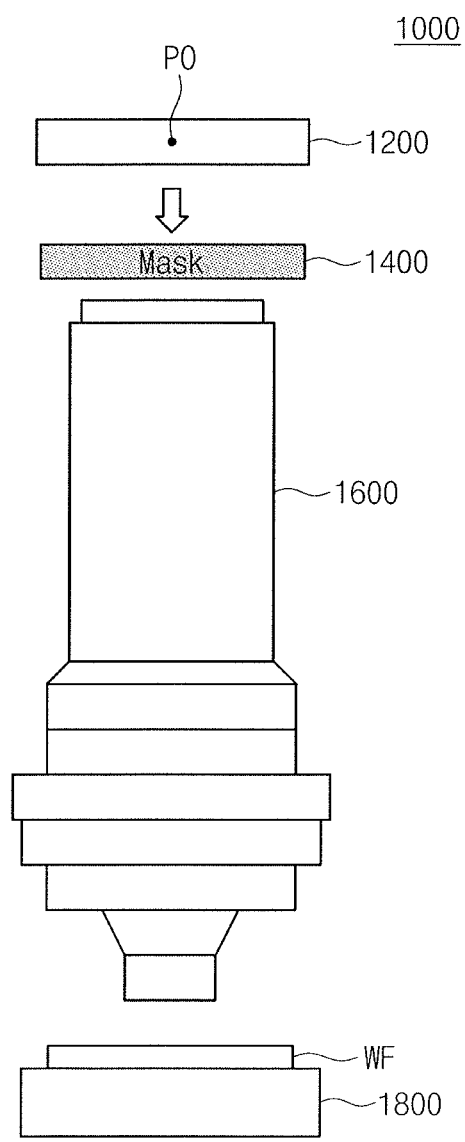
FIG. 5 illustrates a schematic diagram of a photo lithography system, in which a photomask according to some embodiments is used.

FIG. 5 is a schematic diagram of a photolithography system, in which a photomask according to some embodiments is used.

Referring to FIG. 5, a photolithography system 1000 may include a light source 1200, a photomask 1400, a reduction projection apparatus 1600, and a substrate stage 1800. The photomask 1400 may be fabricated, based on a layout which is prepared through a process of designing a semiconductor chip. For example, a process of fabricating the photomask 1400 may include forming a chromium layer on a glass substrate and transcribing or printing layout patterns onto the chromium layer. Although not illustrated in FIG. 5, some additional elements may be provided in the photolithography system 1000. For example, the photolithography system 1000 may further include a sensor for measuring a height and a slope of a top surface of a substrate WF.

The light source 1200 may be configured to emit light. The light emitted from the light source 1200 may be incident into the photomask 1400. To control a focal length, a lens may be provided between the light source 1200 and the photomask 1400. The light source 1200 may be configured to emit an ultraviolet light; for example, the light source 1200 may be a KrF light source (at 234 nm), an ArF light source (at 193 nm), and so forth. The light source 1200 may include a single point light source P0, but the inventive concept may not be limited thereto. In certain embodiments, the light source 1200 may be configured to have a plurality of point light sources.

The photomask 1400 may include image patterns, which are used to transcribe or print the designed layout onto the substrate WF. The image patterns may be defined by transparent and opaque regions formed on the photomask 1400. The transparent region may be formed by etching the metal layer (e.g., the chromium layer) that is provided on the photomask 1400. The transparent region may be configured to allow light, which is incident from the light source 1200, to propagate toward the substrate WF. By contrast, the opaque region may be configured to prevent the light from propagating toward the substrate WF.

The light passing through the transparent region of the photomask 1400 may be incident into the reduction projection apparatus 1600. The light passing through the reduction projection apparatus 1600 may be used to transcribe the image patterns of the photomask 1400 onto the substrate WF and thereby to form layout patterns on the substrate WF. The substrate stage 1800 may be configured to support the substrate WF. The substrate WF may include, for example, a silicon wafer.

The reduction projection apparatus 1600 may include an aperture. The aperture may be used to control a depth of focus, when the ultraviolet light emitted from the light source 1200 is incident onto the substrate WF. As an example, the aperture may include a dipole or quadruple aperture. The reduction projection apparatus 1600 may further include a lens for controlling a focal length.

The transparent region of the photomask 1400 may be configured to allow the light emitted from the light source 1200 to pass therethrough. The light passing through the photomask 1400 may be incident onto the substrate WF through the reduction projection apparatus 1600. Accordingly, patterns corresponding to the image patterns of the photomask 1400 may be printed on the substrate WF.

Figure 6:
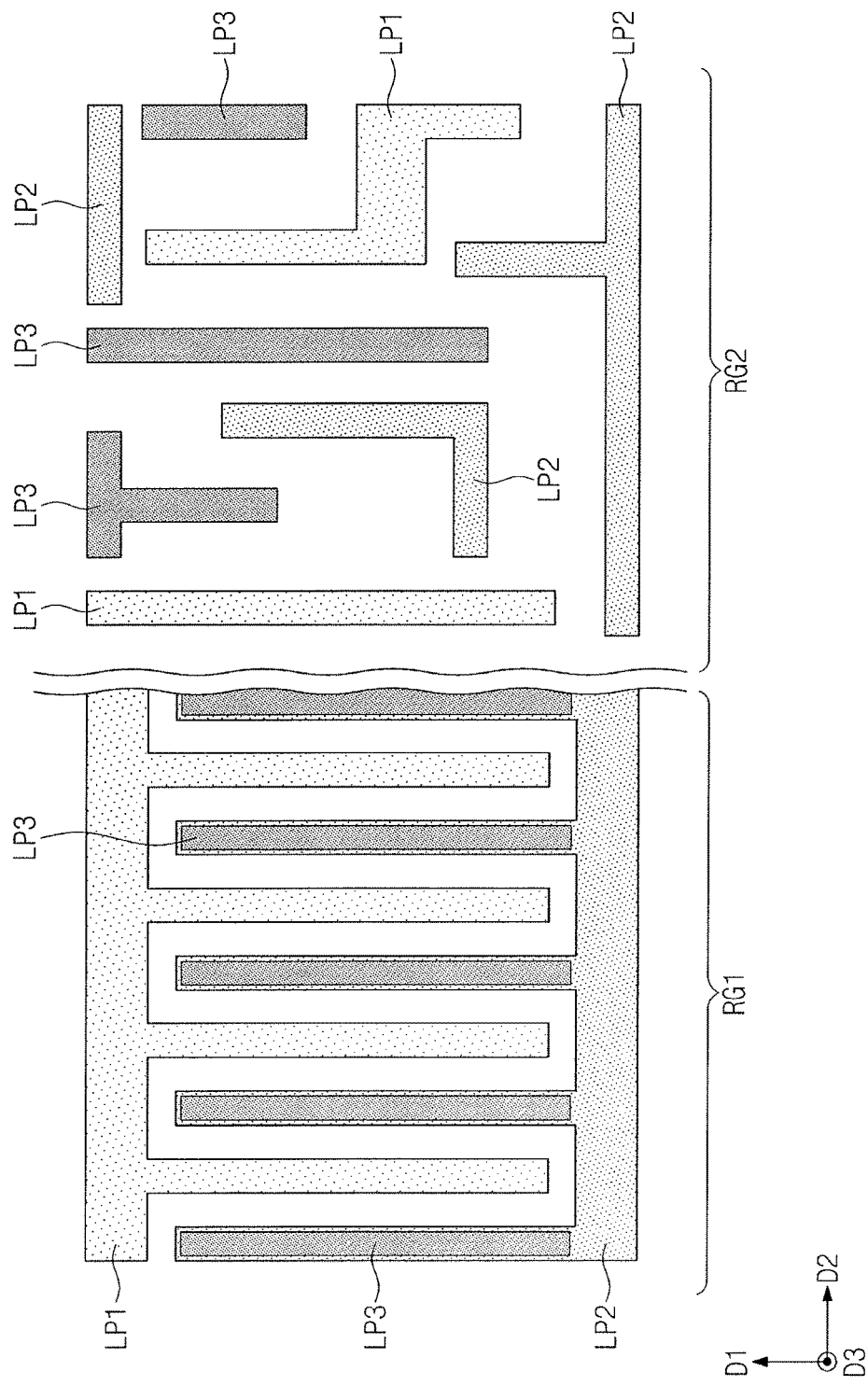
FIG. 6 illustrates a plan view of an example of a layout that is prepared to define a first metal layer of a semiconductor device according to some embodiments.

FIG. 6 is a plan view of an example of a layout that is prepared to define a first metal layer of a semiconductor device according to some embodiments.

Referring to FIG. 6, layout patterns LP1, LP2, and LP3 may be provided on the first and second regions RG1 and RG2. The layout patterns LP1, LP2, and LP3 may include first layout patterns LP1, second layout patterns LP2, and third layout patterns LP3. The first to third layout patterns LP1. LP2, and LP3 may be layouts for defining the first and second conductive wiring patterns M11, M12, and M2 previously described with reference to FIGS. 2 to 4.

A first photomask may be fabricated based on the first layout patterns LP1, a second photomask may be fabricated based on the second layout patterns LP2, and a third photomask may be fabricated based on the third layout patterns LP3. Thus, for example, three different photomasks (e.g., the first to third photomasks) may be fabricated to realize the layout that is exemplarily shown in FIG. 6. Each of the first to third photomasks may be used to form patterns on the substrate WF, as previously described with reference to FIG. 5.

In the second region RG2, the first layout patterns LP1 may be spaced apart from each other, and at least one second layout pattern LP2 or at least one third layout pattern LP3 may be interposed between the first layout patterns LP1. The second layout patterns LP2 may be spaced apart from each other, and at least one first layout pattern LP1 or at least one third layout pattern LP3 may be interposed between the second layout patterns LP2. The third layout patterns LP3 may be spaced apart from each other, and at least one first layout pattern LP1 or at least one second layout pattern LP2 may be interposed between the third layout patterns LP3.

An increase in integration density of a semiconductor device may lead to reduction in a distance between the conductive wiring patterns M11, M12, and M2. Owing to such a proximity effect, if the conductive wiring patterns M11, M12, and M2 are realized by a single photomask, a pattern formed on the substrate may have a distorted shape that is different from that of the layout. By contrast, according to some embodiments, a plurality of photomasks may be used to realize the conductive wiring patterns M11, M12, and M2, and in this case, it may be possible to increase a space between image patterns provided on each photomask. Accordingly, it may be possible to prevent a pattern formed on a substrate from being distorted.

In the first region RG1, the third layout patterns LP3 may be overlapped with the second layout pattern LP2. As an example, the third layout patterns LP3 may be completely overlapped with the second layout pattern LP2. As another example, the third layout patterns LP3 may be overlapped with the first layout pattern LP1.

Figure 7:
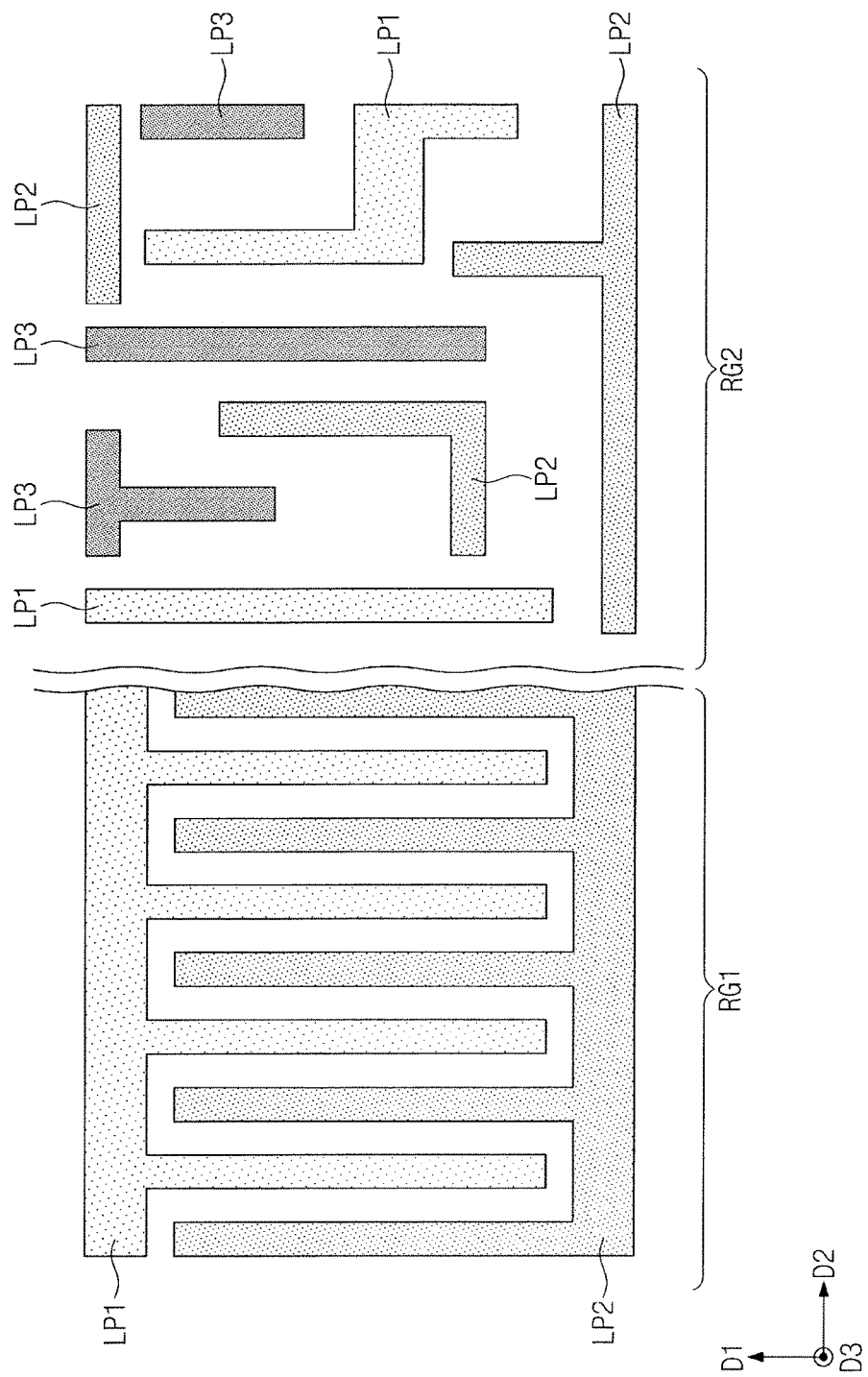
FIG. 7 illustrates a plan view of a layout according to a comparative example.

FIG. 7 is a plan view of a layout according to a comparative example. The third layout patterns LP3 may be omitted in the first region RG1 of FIG. 7. In this case, there may be no image pattern in the first region RG1 of the third photomask. Thus, the first region RG1 of the third photomask may have an empty region with no image pattern.

The uniformity in density of the image patterns over the entire region of a photomask may be one of process parameters that is desirable for the exposing and developing process described with reference to FIG. 5. If, as shown in FIG. 7, there is the empty region in the first region RG1 of the third photomask, adjacent image patterns may be printed on the first region RG1 of the substrate to have distorted shapes.

By contrast, referring back to FIG. 6, the layout according to some embodiments may include the third layout patterns LP3 provided in the first region RG1, and this may help to prevent the empty region from being formed in the first region RG1 of the third photomask. Thus, it may be possible to improve the uniformity in density of the image pattern of the third photomask and thereby to prevent adjacent ones of the image patterns, which will be printed on the first region RG1, from being distorted.

FIGS. 8A to 15A are plan views illustrating a method of fabricating a semiconductor device, according to some embodiments. FIGS. 8B to 15B are sectional views taken along lines I-I' and II-II' of FIGS. 8A to 15A, respectively.

Figure 8B:
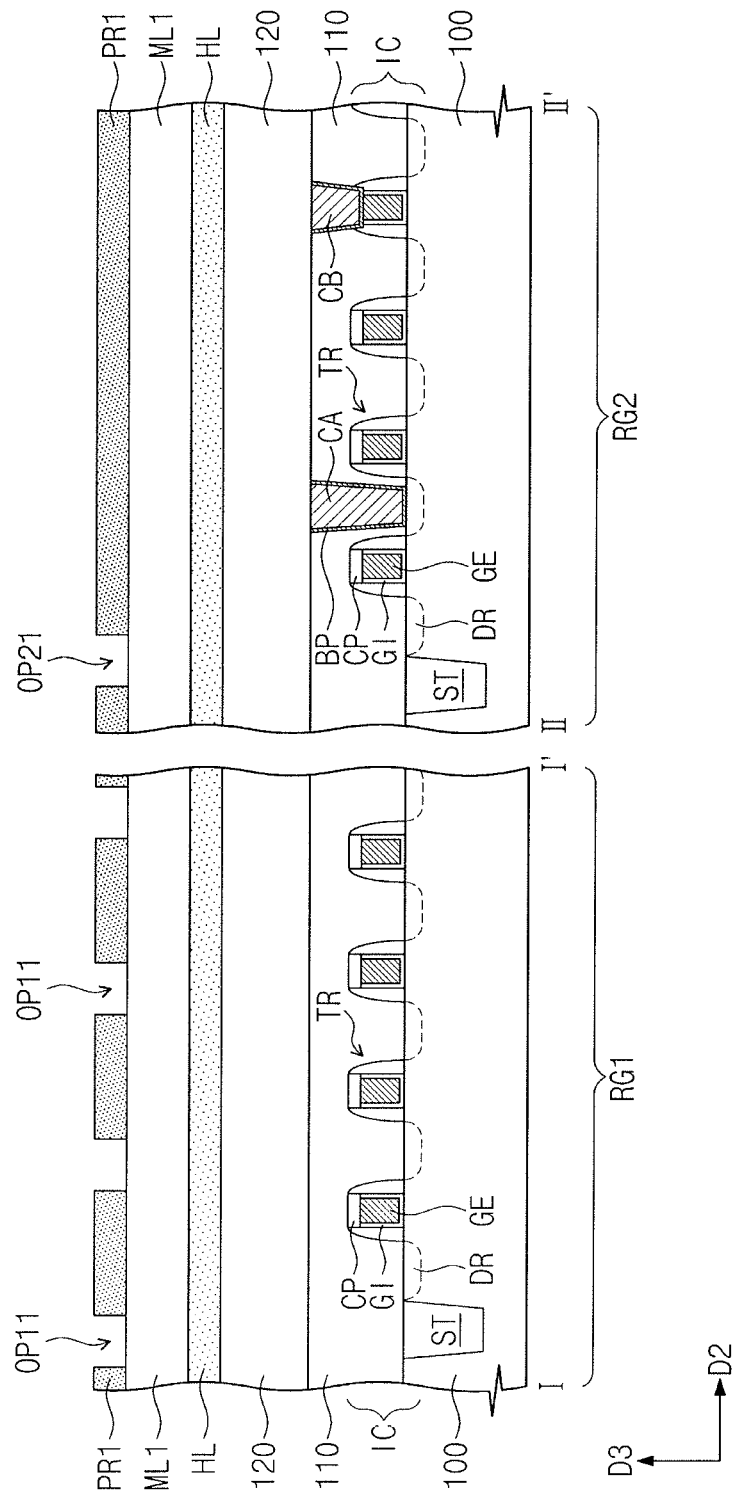
FIGS. 8B, 9B, 10B, 11B 12B, 13B, 14B, and 15B illustrate sectional views taken along lines I-I' and II-II' of FIGS. 8A, 9A, 10A, 11A. 12A, 13A, 14A, and 15A, respectively.

Referring to FIGS. 6, 8A, and 8B, the integrated circuit IC may be formed on the substrate 100 with the first and second regions RG1 and RG2. The substrate 100 may be, for example, a silicon wafer, a germanium wafer, or a silicon-germanium wafer.

The formation of the integrated circuit IC may include forming a plurality of the transistors TR. For example, the device isolation layers ST may be formed to define the active regions of the transistors TR. The gate electrode GE, the gate dielectric layer GI interposed between the gate electrode GE and the substrate 100, and the capping pattern CP covering a top surface of the gate electrode GE may be formed on the active region. The impurity regions DR may be formed at both sides of the gate electrode GE. The impurity regions DR may be formed by doping the substrate 100 with impurities.

Thereafter, the first interlayer insulating layer 110 may be formed on the substrate 100 to cover the transistors TR. As an example, the first interlayer insulating layer 110 may be formed of or include a silicon oxide layer or a silicon oxynitride layer.

The first contact CA and the second contact CB may be formed in the second region RG2 and in the first interlayer insulating layer 110. For example, the formation of the first and second contacts CA and CB may include patterning the first interlayer insulating layer 110 to form holes exposing the impurity region DR and the gate electrode GE and then filling the holes with a conductive layer. Here, the conductive layer may be formed of or include, for example, a metallic material (e.g., copper (Cu) or tungsten (W)).

Before the formation of the conductive layer, a barrier layer may be formed in the holes. In this case, the barrier pattern BP may be formed to cover side and bottom surfaces of each of the first and second contacts CA and CB. The barrier layer may be formed of or include at least one of, for example, Ti or TiN.

The second interlayer insulating layer 120 may be formed on the first interlayer insulating layer 110. A hard mask layer HL and a first mold layer ML1 may be sequentially formed on the second interlayer insulating layer 120. The hard mask layer HL may have an etch selectivity with respect to the first mold layer ML1 and the second interlayer insulating layer 120. The hard mask layer HL may be formed of or include an organic layer, an inorganic layer, or a double-layered structure including them. As an example, the hard mask layer HL may include a silicon nitride layer. The first mold layer ML1 may include a spin-on hardmask (SOH) layer, a spin-on carbon (SOC) layer, or an amorphous carbon layer.

A first photoresist pattern PR1 with first openings OP11 and OP21 may be formed on the first mold layer ML1. For example, the formation of the first photoresist pattern PR1 may include forming a first photoresist layer on the first mold layer ML1 and performing an exposing and developing process on the first photoresist layer using the first photomask described with reference to FIG. 6. In this case, the first opening OP11 on the first region RG1 may be realized by the first layout pattern LP1 on the first region RG1, and the first openings OP21 in the second region RG2 may be realized by the first layout patterns LP1 in the second region RG2.

Figure 9A:
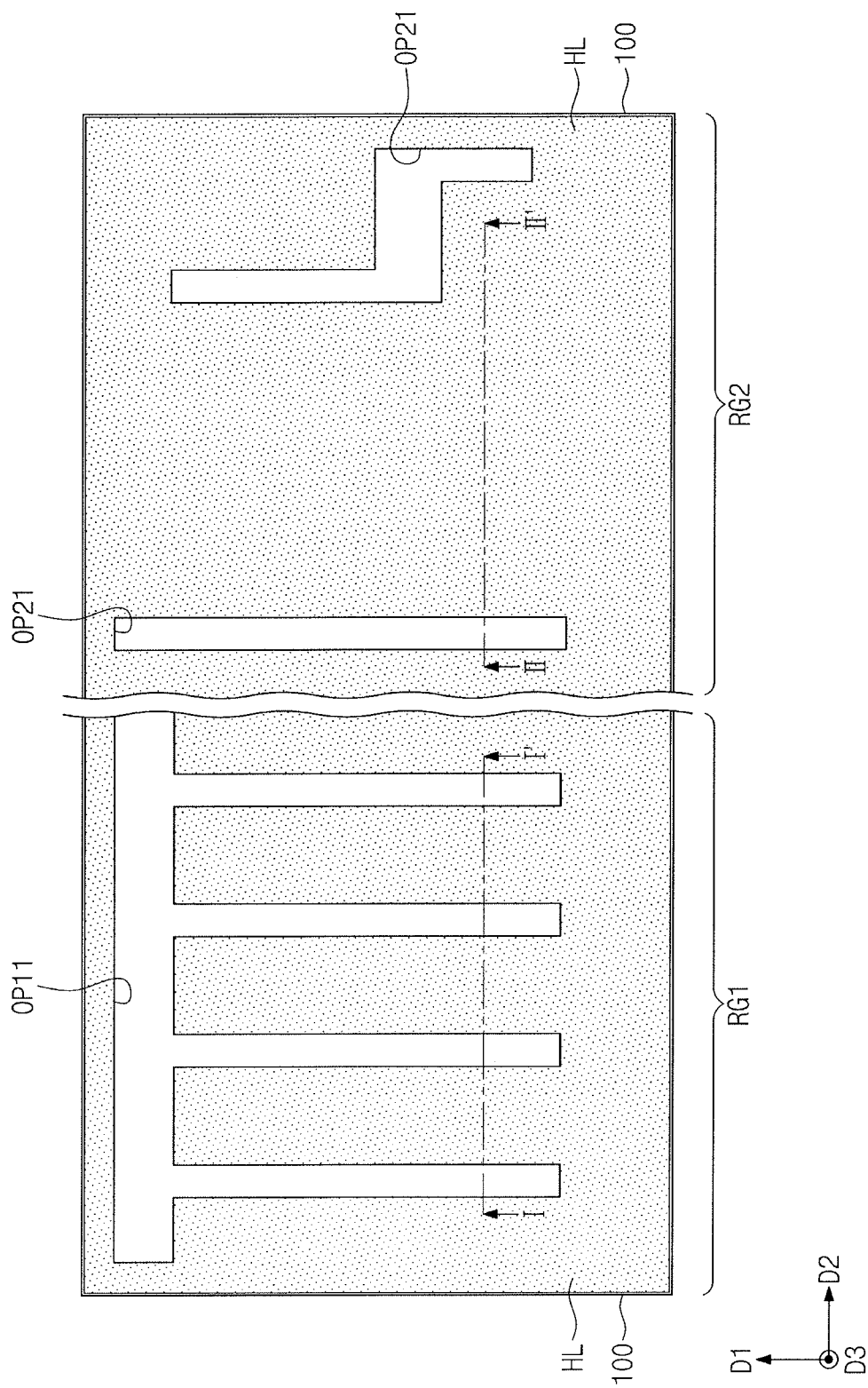
Figure 9B:
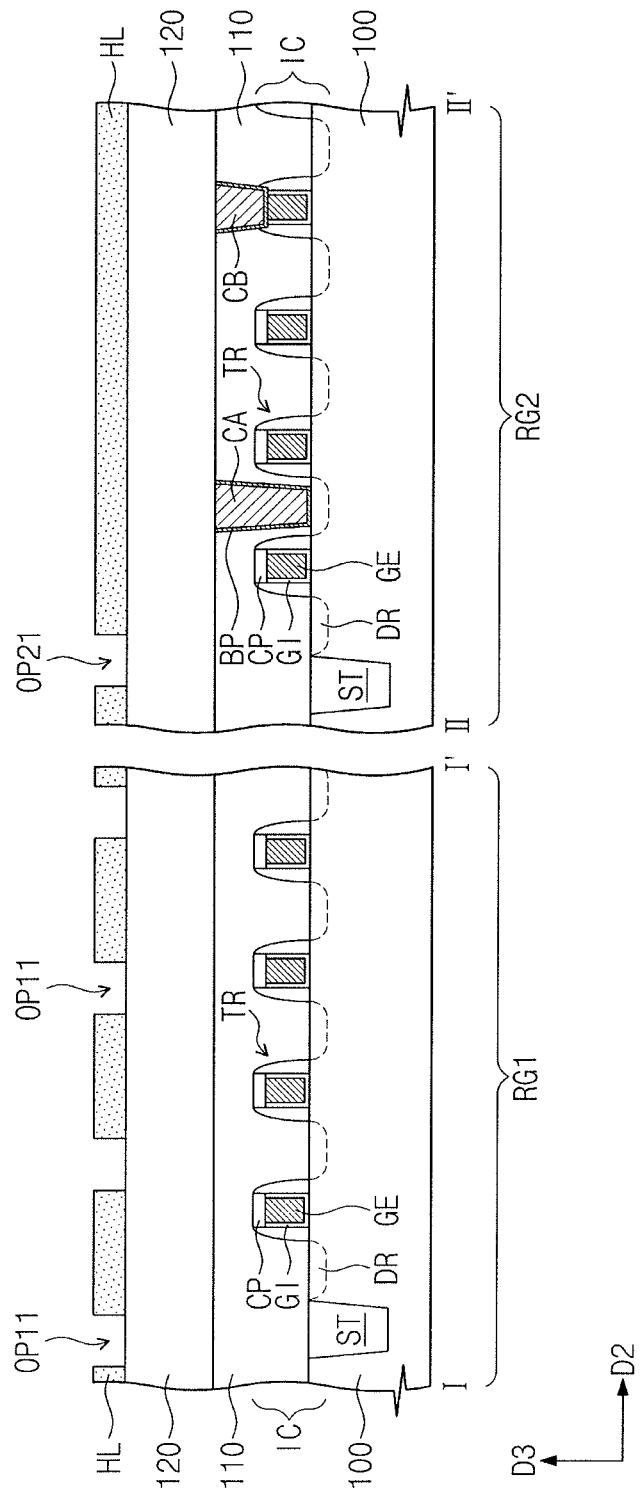

Referring to FIGS. 6, 9A, and 9B, a first patterning process using the first photoresist pattern PR1 as a mask may be performed to form the first openings OP11 and OP21 in the hard mask layer HL. For example, the first patterning process may include patterning the first mold layer ML1 using the first photoresist pattern PR1 as a mask, and then, patterning the hard mask layer HL using the patterned first mold layer ML1 as a mask. The first openings OP11 and OP21, which are formed by the first patterning process, may have substantially the same planar shapes as those of the first openings OP11 and OP21 of the first photoresist pattern PR1 shown in FIG. 8A. After the first patterning process, the remaining portions of the first photoresist pattern PR1 and the first mold layer ML1 may be removed.

Figure 10A:
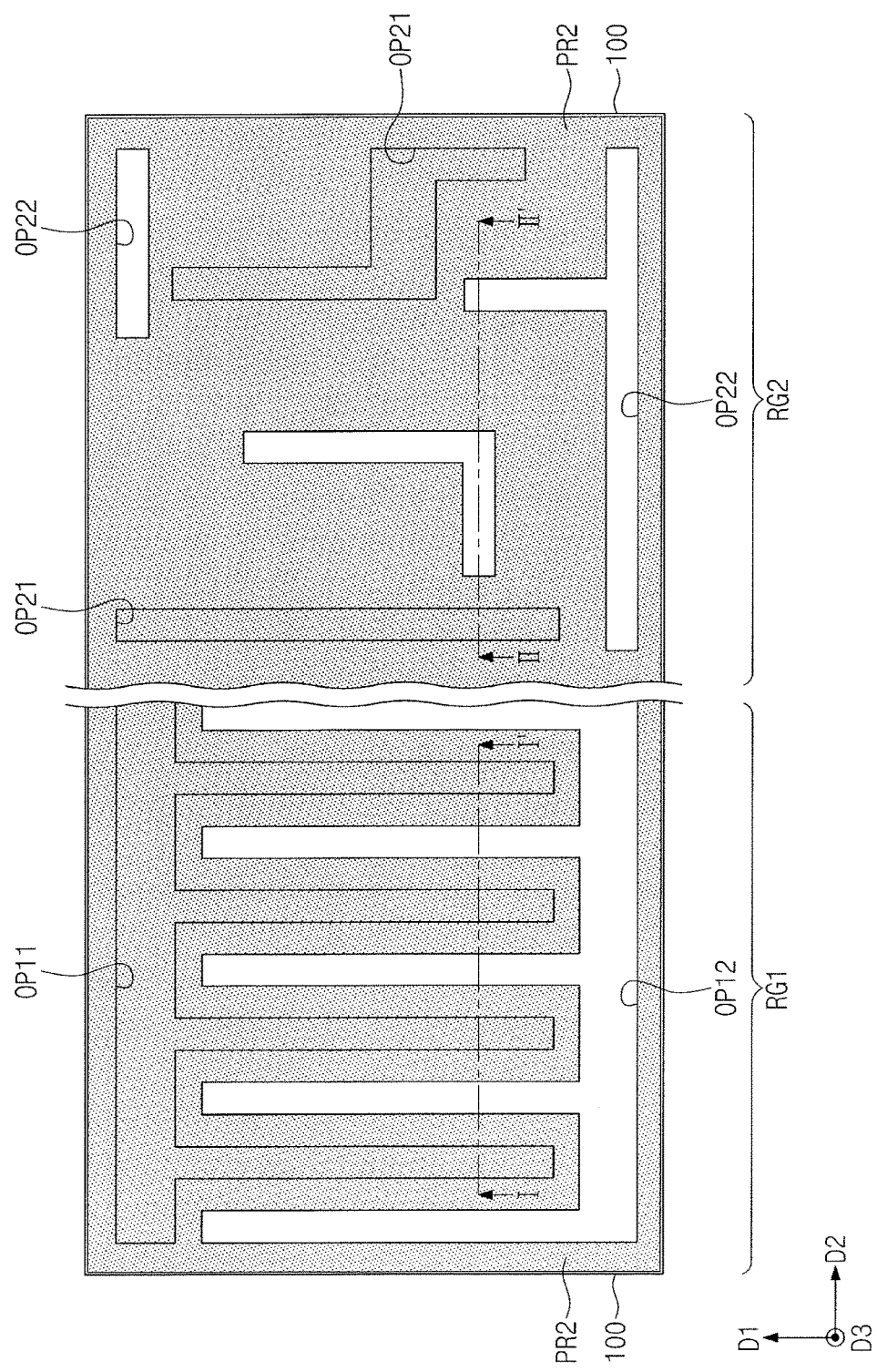
Figure 10B:
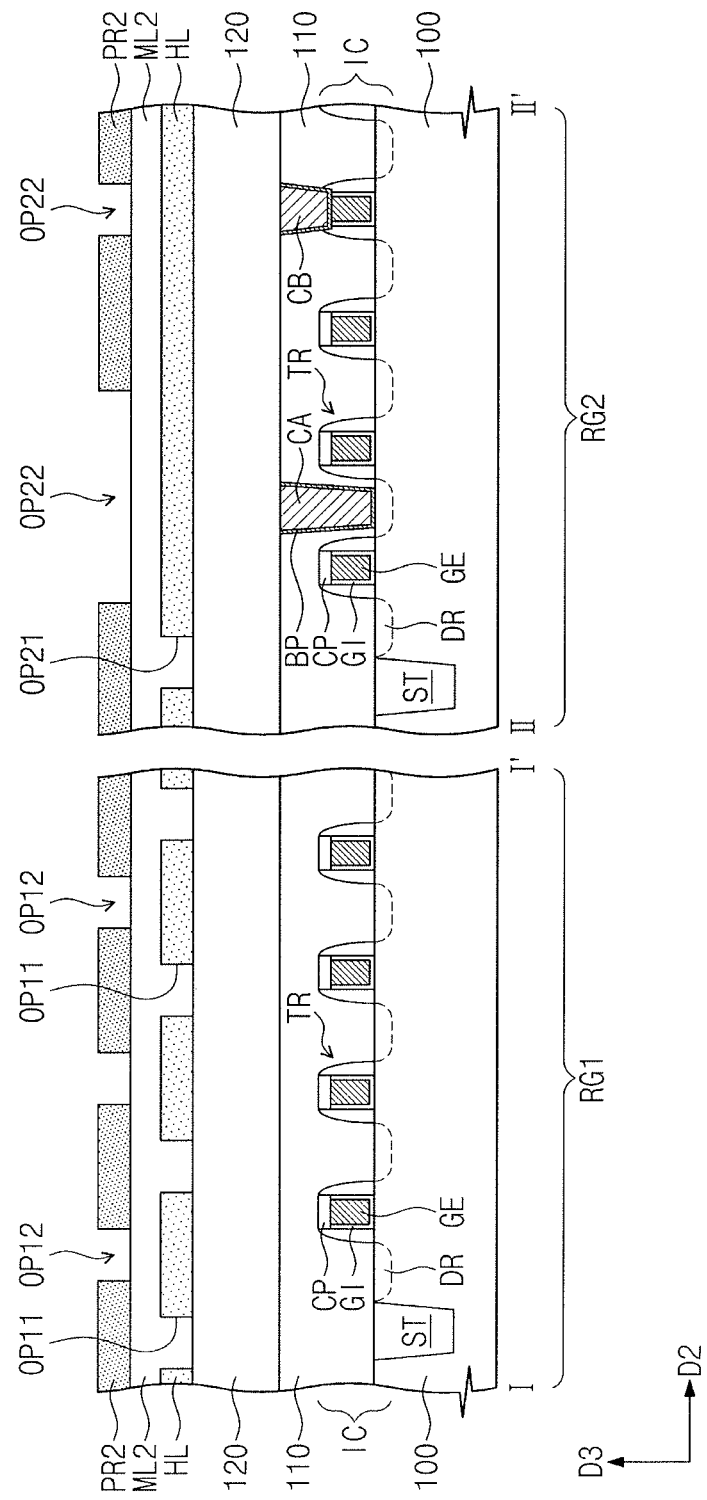

Referring to FIGS. 6, 10A, and 10B, a second mold layer ML2 may be formed to cover the hard mask layer HL. The second mold layer ML2 may be formed of or include the same material as that of the first mold layer ML1.

A second photoresist pattern PR2 with second openings OP12 and OP22 may be formed on the second mold layer ML2. For example, the formation of the second photoresist pattern PR2 may include forming a second photoresist layer on the second mold layer ML2, and performing an exposing and developing process on the second photoresist layer using the second photomask described with reference to FIG. 6. In this case, the second opening OP12 on the first region RG1 may be realized by the second layout pattern LP2 on the first region RG1, and the second openings OP22 in the second region RG2 may be realized by the second layout patterns LP2 in the second region RG2.

Figure 11A:
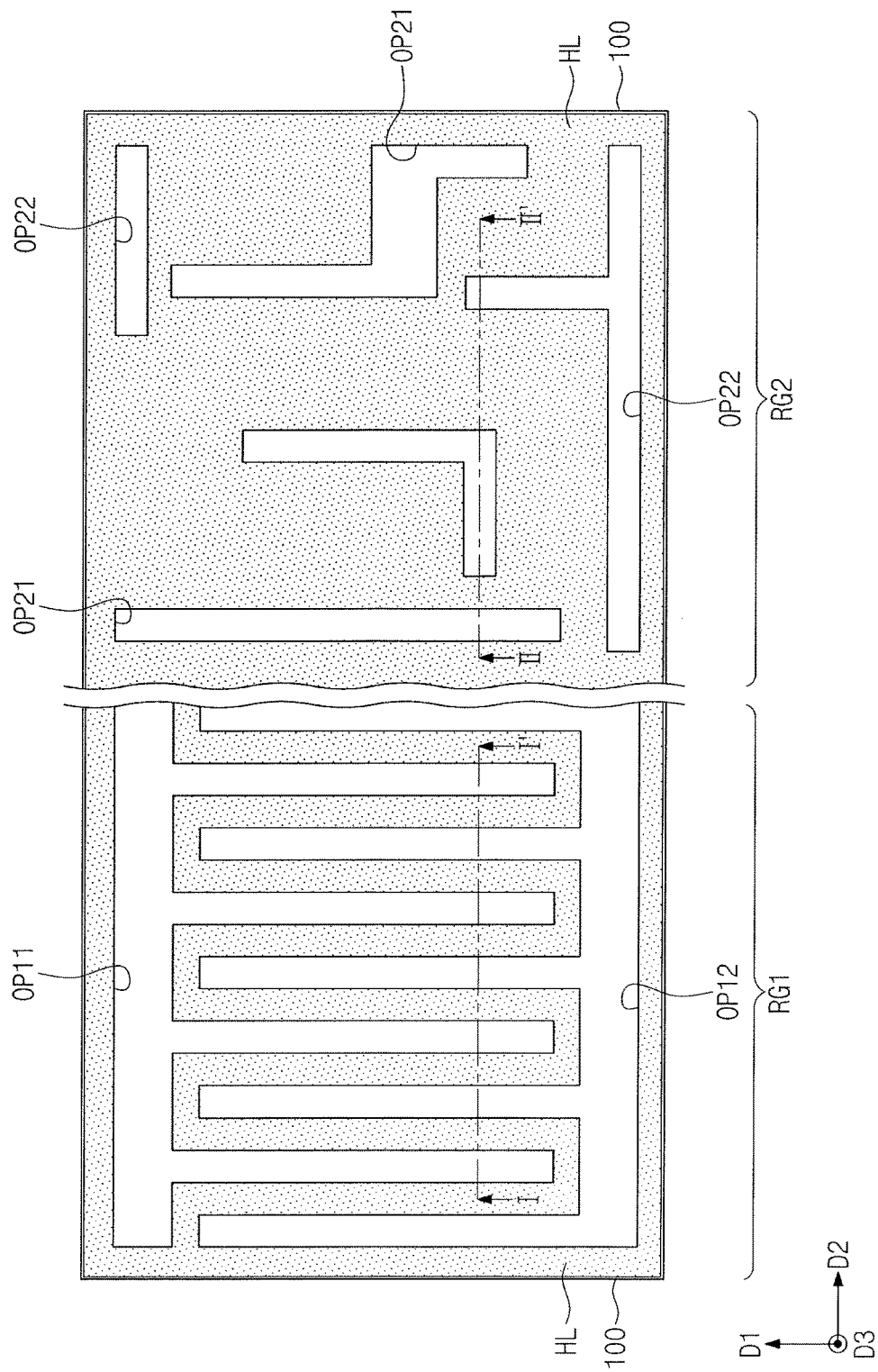
Figure 11B:
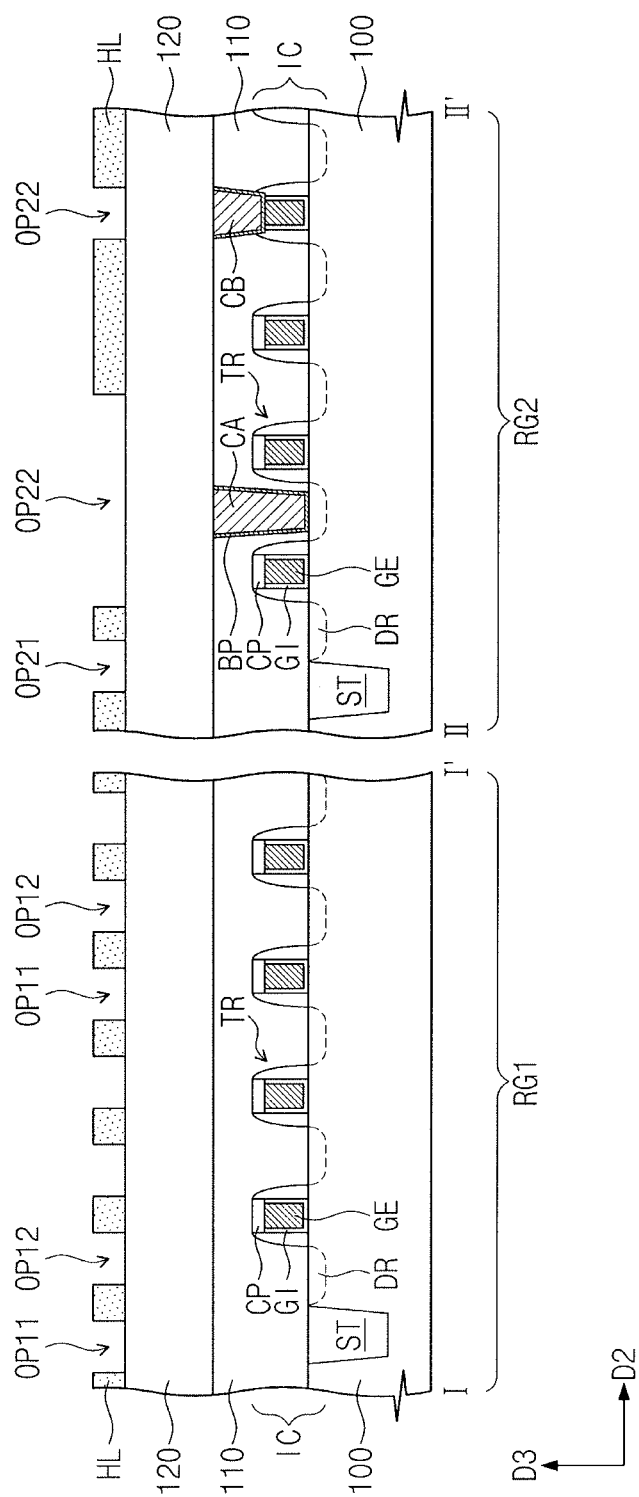

Referring to FIGS. 6, 11A, and 11B, a second patterning process using the second photoresist pattern PR2 as a mask may be performed to further form the second openings OP12 and OP22 in the hard mask layer HL. For example, the second patterning process may include patterning the second mold layer ML2 using the second photoresist pattern PR2 as a mask, and patterning the hard mask layer HL using the patterned second mold layer ML2 as a mask. The second openings OP12 and OP22, which are formed by the second patterning process, may have substantially the same planar shapes as those of the second openings OP12 and OP22 of the second photoresist pattern PR2 shown in FIG. 10A. After the second patterning process, the remaining portions of the second photoresist pattern PR2 and the second mold layer ML2 may be removed.

Figure 12A:
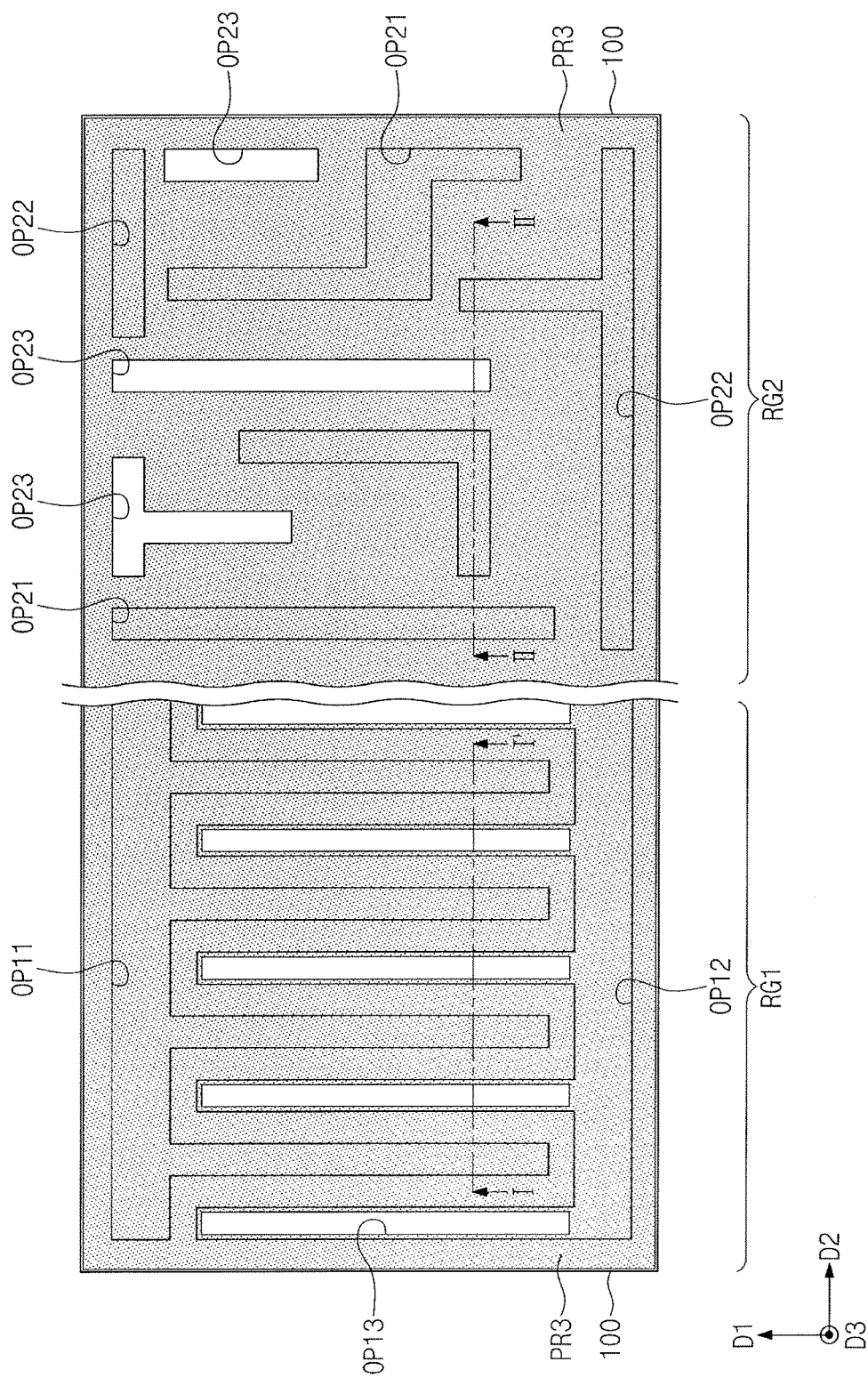
Figure 12B:
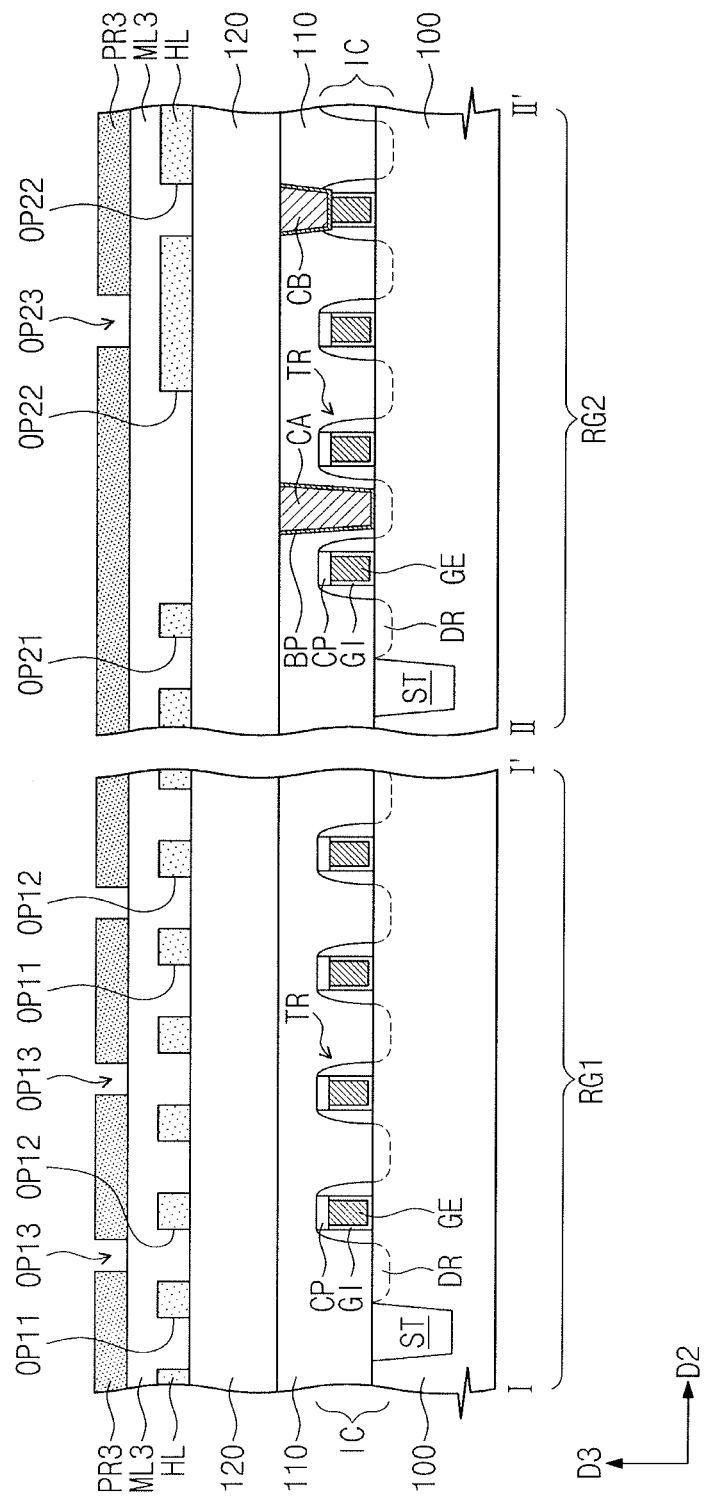

Referring to FIGS. 6, 12A, and 12B, a third mold layer ML3 may be formed to cover the hard mask layer HL. The third mold layer ML3 may be formed of or include the same material as that of the first mold layer ML1. A third photoresist pattern PR3 with third openings OP13 and OP23 may be formed on the third mold layer ML3. For example, the formation of the third photoresist pattern PR3 may include forming a third photoresist layer on the third mold layer ML3, and then, performing an exposing and developing process on the third photoresist layer using the third photomask described with reference to FIG. 6. In this case, the third openings OP13 on the first region RG1 may be realized by the third layout patterns LP3 on the first region RG1, and the third openings OP23 in the second region RG2 may be realized by the third layout patterns LP3 in the second region RG2.

As described with reference to FIG. 6, the third layout patterns LP3 on the first region RG1 may be overlapped with the second layout pattern LP2 on the first region RG1. Thus, the third openings OP13 on the first region RG1 may be overlapped with the second opening OP12 of the hard mask layer HL on the first region RG1, when viewed in a plan view.

Figure 13A:
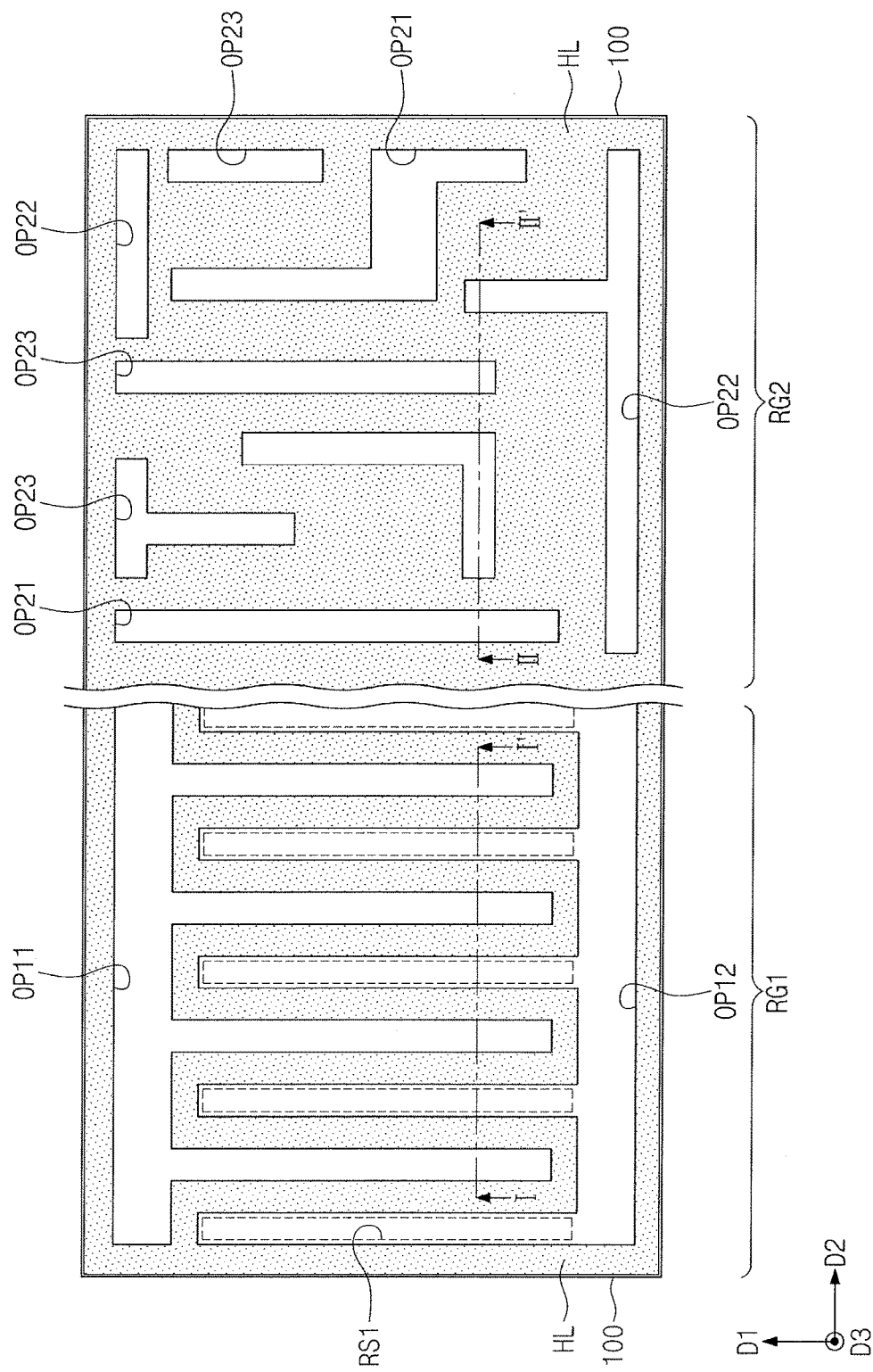
Figure 13B:
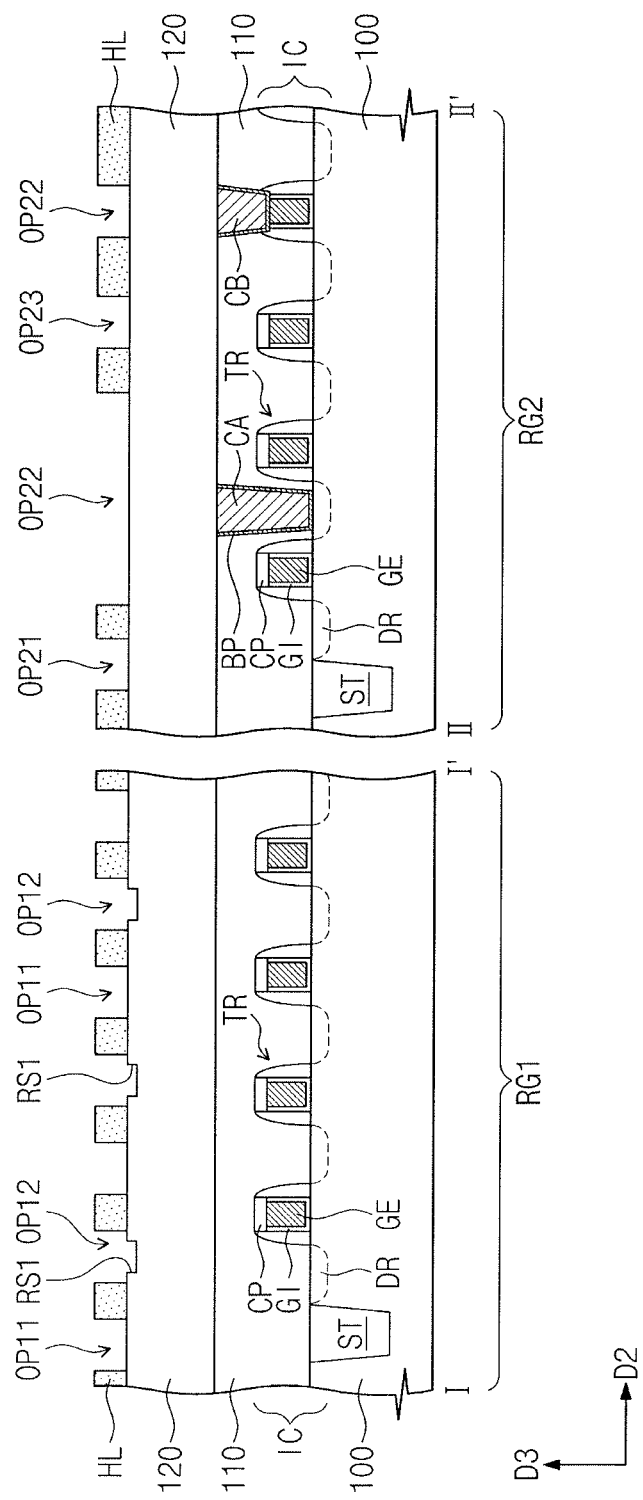

Referring to FIGS. 6, 13A, and 13B, a third patterning process using the third photoresist pattern PR3 as a mask may be performed to further form the third openings OP23 in the hard mask layer HL. For example, the third patterning process may include patterning the third mold layer ML3 using the third photoresist pattern PR3 as a mask and patterning the hard mask layer HL using the patterned third mold layer ML3 as a mask. The third patterning process may be performed in such a way that the third openings OP23 are selectively formed in only the second region RG2. Thus, for the first region RG1, the third openings OP13 are overlapped with the second opening OP12. The third openings OP23, which are formed by the third patterning process, may have substantially the same planar shapes as those of the third openings OP23 of the third photoresist pattern PR3 in the second region RG2 shown in FIG. 12A.

In addition, the third patterning process may be performed to form first recess regions RS1 on the first region RG1. The first recess regions RS1 may be formed in the second opening OP12 on the first region RG1 and in an upper portion of the second interlayer insulating layer 120. For example, the third patterning process may include etching a portion of the second interlayer insulating layer 120 that is exposed through the second opening OP12 on the first region RG1. However, the second interlayer insulating layer 120 has an etch selectivity with respect to the hard mask layer HL, and thus the exposed portion of the second interlayer insulating layer 120 may be slightly etched to form the first recess regions RS1. The first recess regions RS1, which are formed by the third patterning process, may have substantially the same planar shapes as those of the third openings OP13 of the third photoresist pattern PR3 on the first region RG1 shown in FIG. 12A.

After the third patterning process, the remaining portions of the third photoresist pattern PR3 and the third mold layer ML3 may be removed.

Figure 14A:
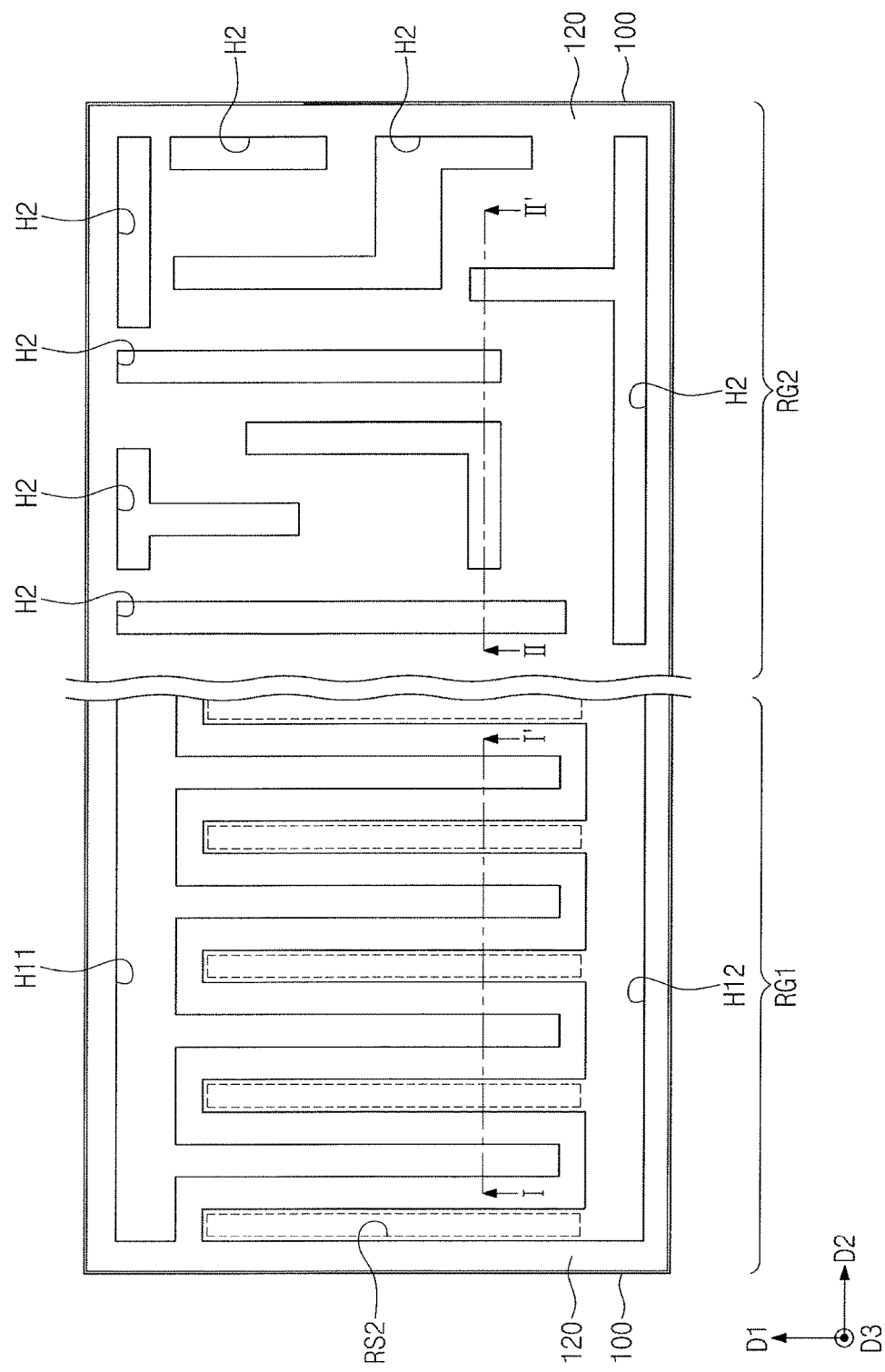
Figure 14B:
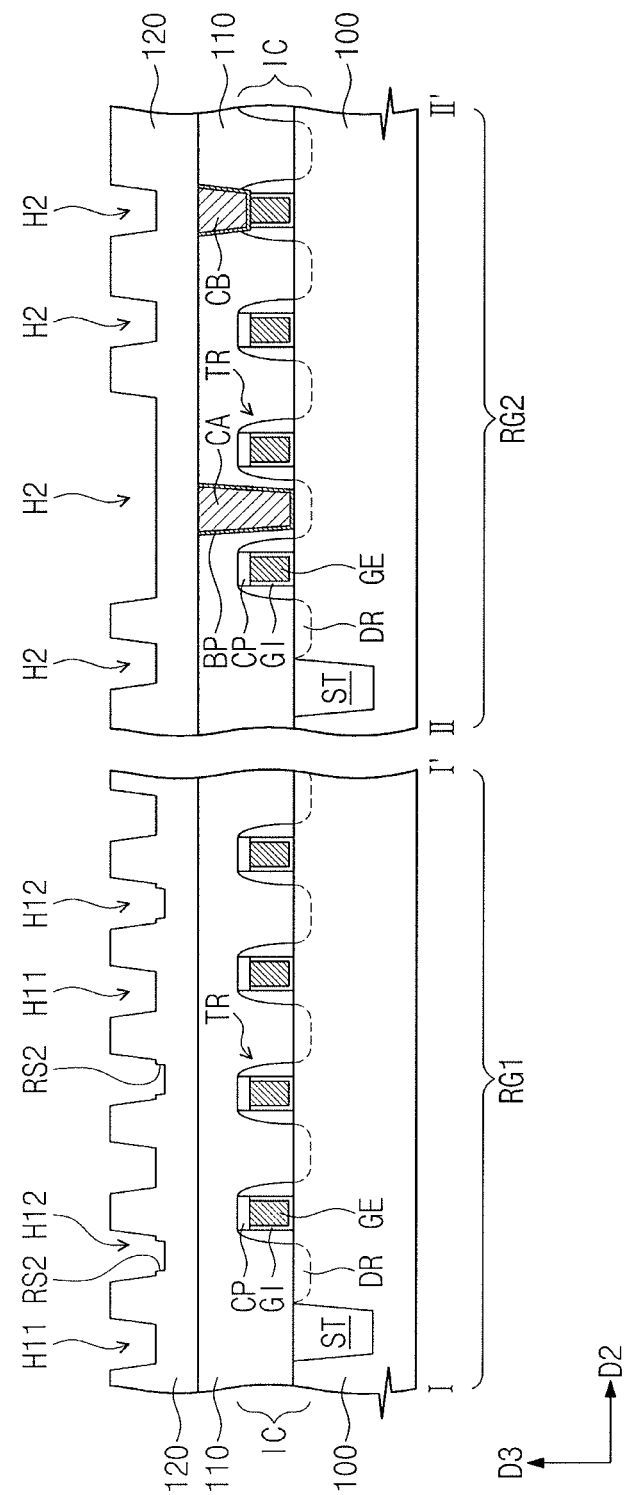

Referring to FIGS. 14A and 14B, an upper portion of the second interlayer insulating layer 120 may be etched using the hard mask layer HL with the first to third openings OP11, OP21, OP12, OP22, and OP23 as an etch mask. As a result, first wire holes H11 and H12 may be formed in the second interlayer insulating layer 120 on the first region RG1, and second wire holes H2 may be formed in the second interlayer insulating layer 120 in the second region RG2.

The first wire holes H11 and H12 on the first region RG1 may include a first hole H11 and a second hole H12. The first and second holes H11 and H12 may be respectively formed by the first and second openings OP11 and OP12 on the first region RG1 shown in FIGS. 13A and 13B. The second wire holes H2 in the second region RG2 may be respectively formed by the first to third openings OP21, OP22, and OP23 in the second region RG2 shown in FIGS. 13A and 13B.

Second recess regions RS2 may be formed in the second hole H12 on the first region RG1. When the second hole H12 is formed on the first region RG1, the first recess regions RS1 may be further etched, and the second recess regions RS2 may be formed by such an additional etching process on the first recess regions RS1. Thus, a bottom surface of the second hole H12 on the first region RG1 may be lower than a bottom surface of the first hole H11 on the first region RG1 and bottom surfaces of the second wire holes H2 in the second region RG2.

Figure 15A:
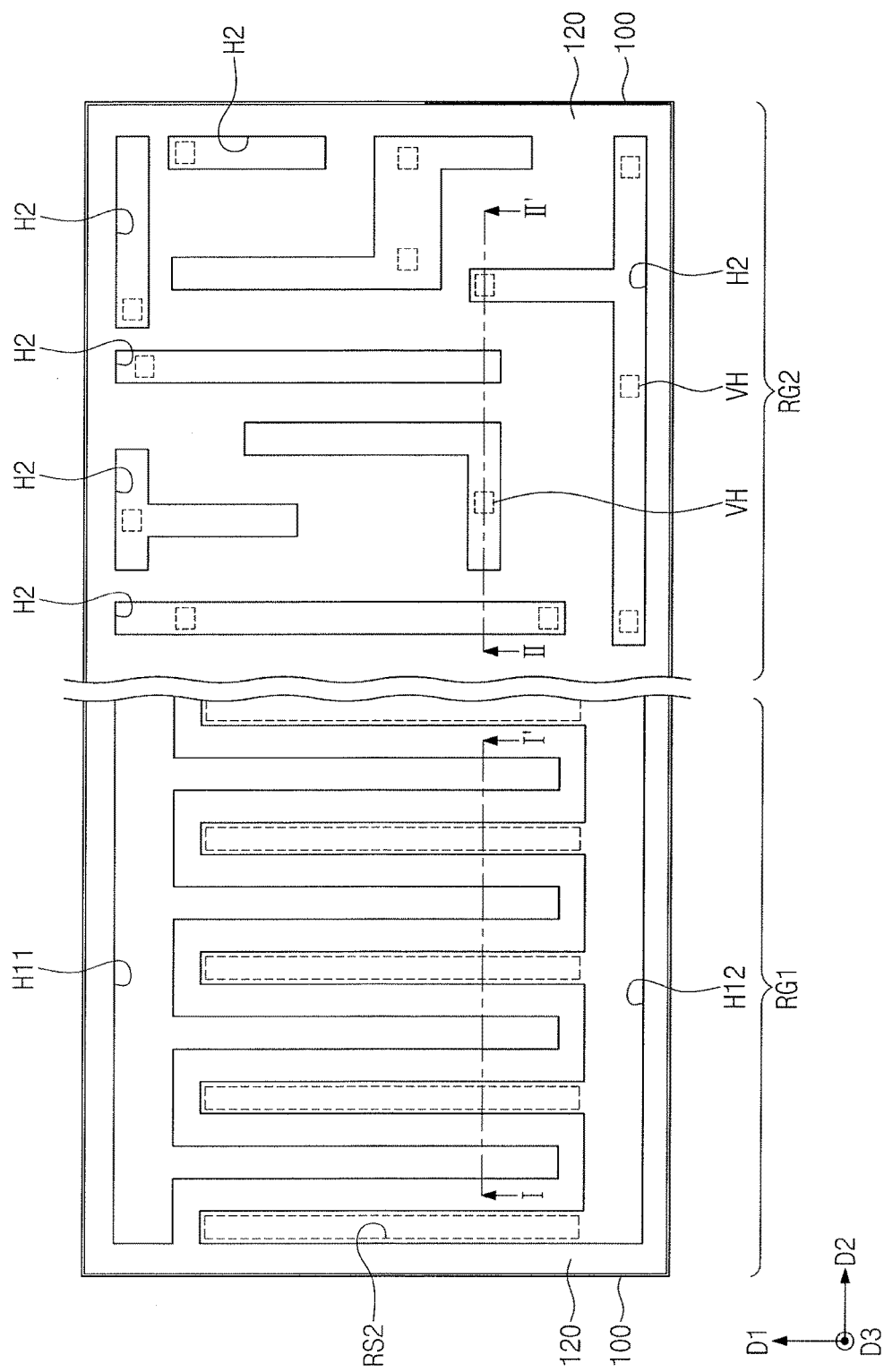
Figure 15B:
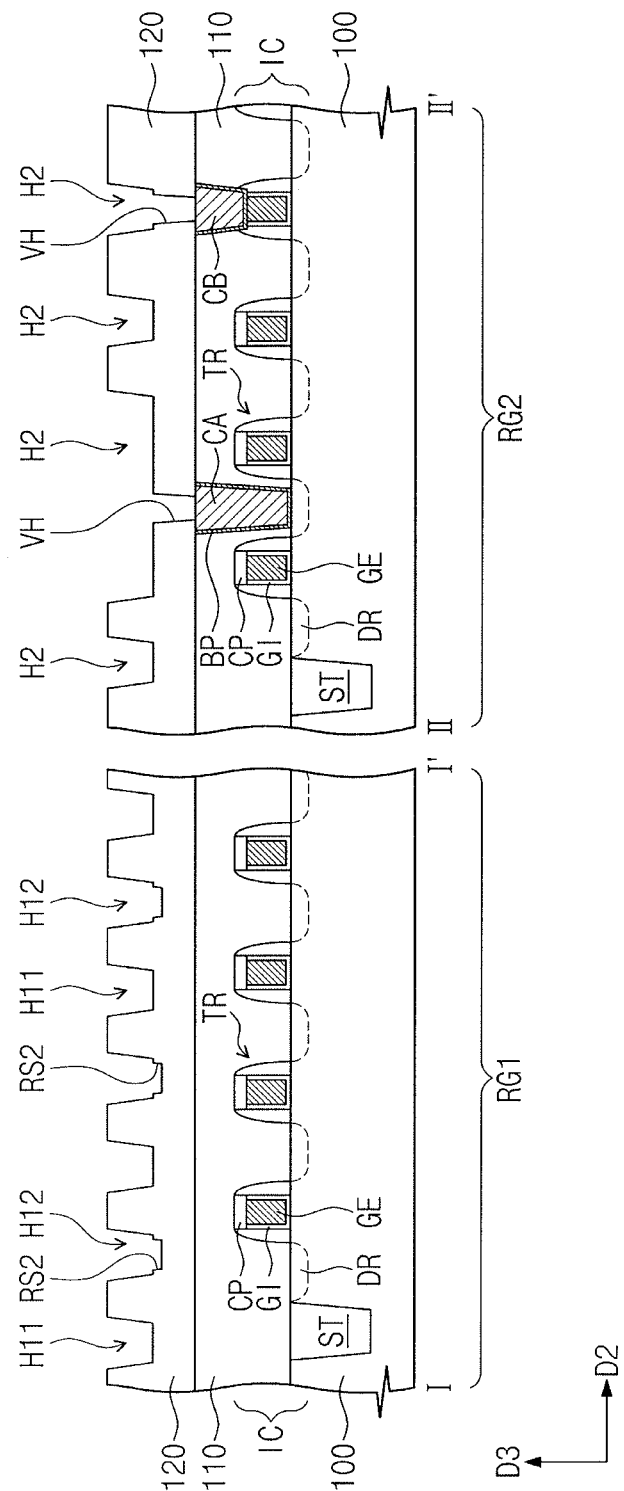

Referring to FIGS. 15A and 15B, a vertical through hole VH may be formed in at least one second wire hole H2. For example, a hard mask layer may be formed on the second interlayer insulating layer 120, and a photoresist pattern may be formed on the hard mask layer to define shapes and positions of the vertical through holes VH. Thereafter, the hard mask layer and the second interlayer insulating layer 120 may be sequentially etched using the photoresist pattern as an etch mask, and as a result, the vertical through holes VH may be formed. The vertical through holes VH may be formed to expose the first and second contacts CA and CB.

Referring back to FIGS. 2 and 3, the first conductive wiring patterns M11 and M12 may be formed in the first wire holes H11 and H12, and the second conductive wiring patterns M2 may be formed in the second wire holes H2. For example, a barrier layer and a conductive layer may be sequentially formed to fill the first and second wire holes H11, H12, and H2. The conductive layer may be formed of or include a metallic material (e.g., copper (Cu) or tungsten (W)), and the barrier layer may be formed of or include at least one of Ti or TiN. Thereafter, the conductive layer and the barrier layer may be planarized to form the first and second conductive wiring patterns M11, M12, and M2 and the barrier patterns BP.

Figure 16:
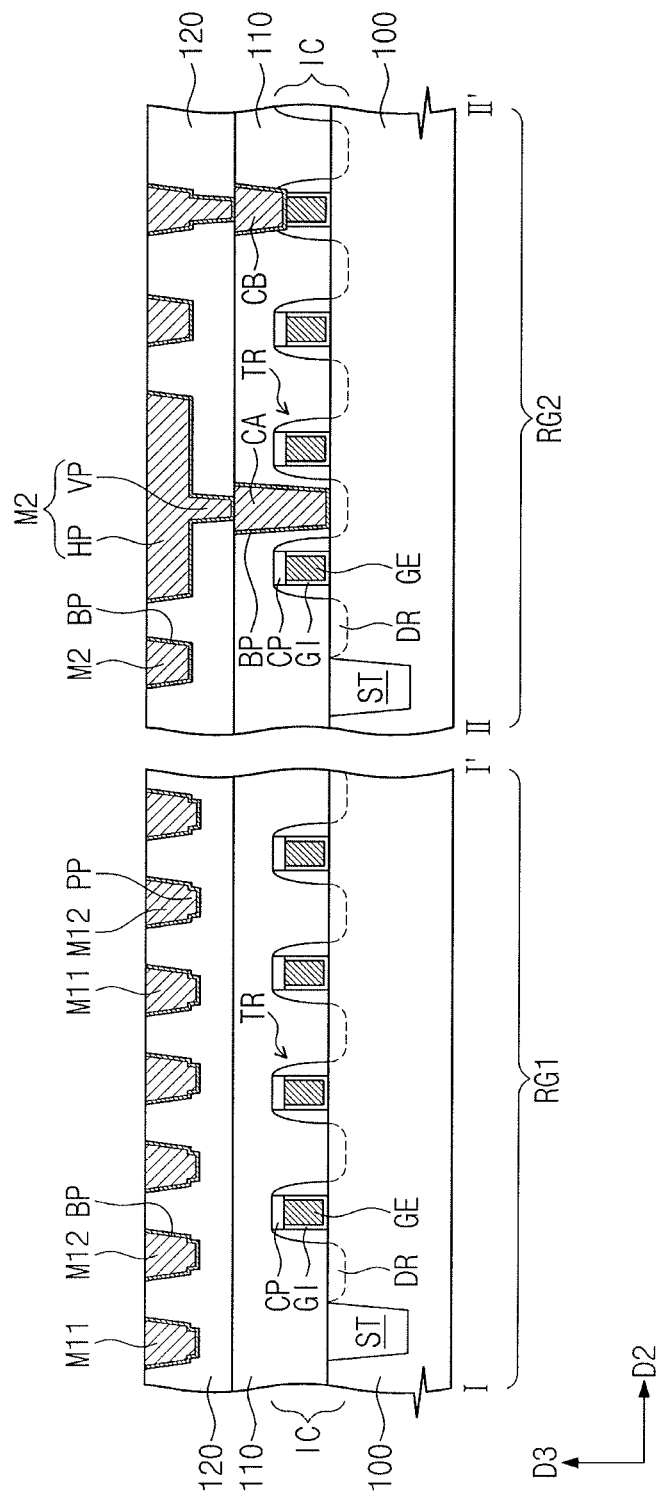
FIG. 16 illustrates a sectional view that is taken along lines I-I' and II-II' of FIG. 2 to illustrate a semiconductor device according to some embodiments.

FIG. 16 is a sectional view taken along lines I-I' and II-II' of FIG. 2 to illustrate a semiconductor device according to some embodiments. In the following description, the elements and features similar to those of the semiconductor device described with reference to FIGS. 1 to 4 will not be described in much further detail, for the sake of brevity.

Referring to FIGS. 2 and 16, the first conductive wiring patterns M11 and M12 on the first region RG1 may include the first wires M11 and the second wires M12. Each of the first wires M11 may include the protruding portion PP vertically extending toward the substrate 100. Thus, each of the first and second wires M11 and M12 may include the protruding portion PP. A sectional shape of the first wire M11 may be substantially the same as that of the second wire M12.

Figure 17:
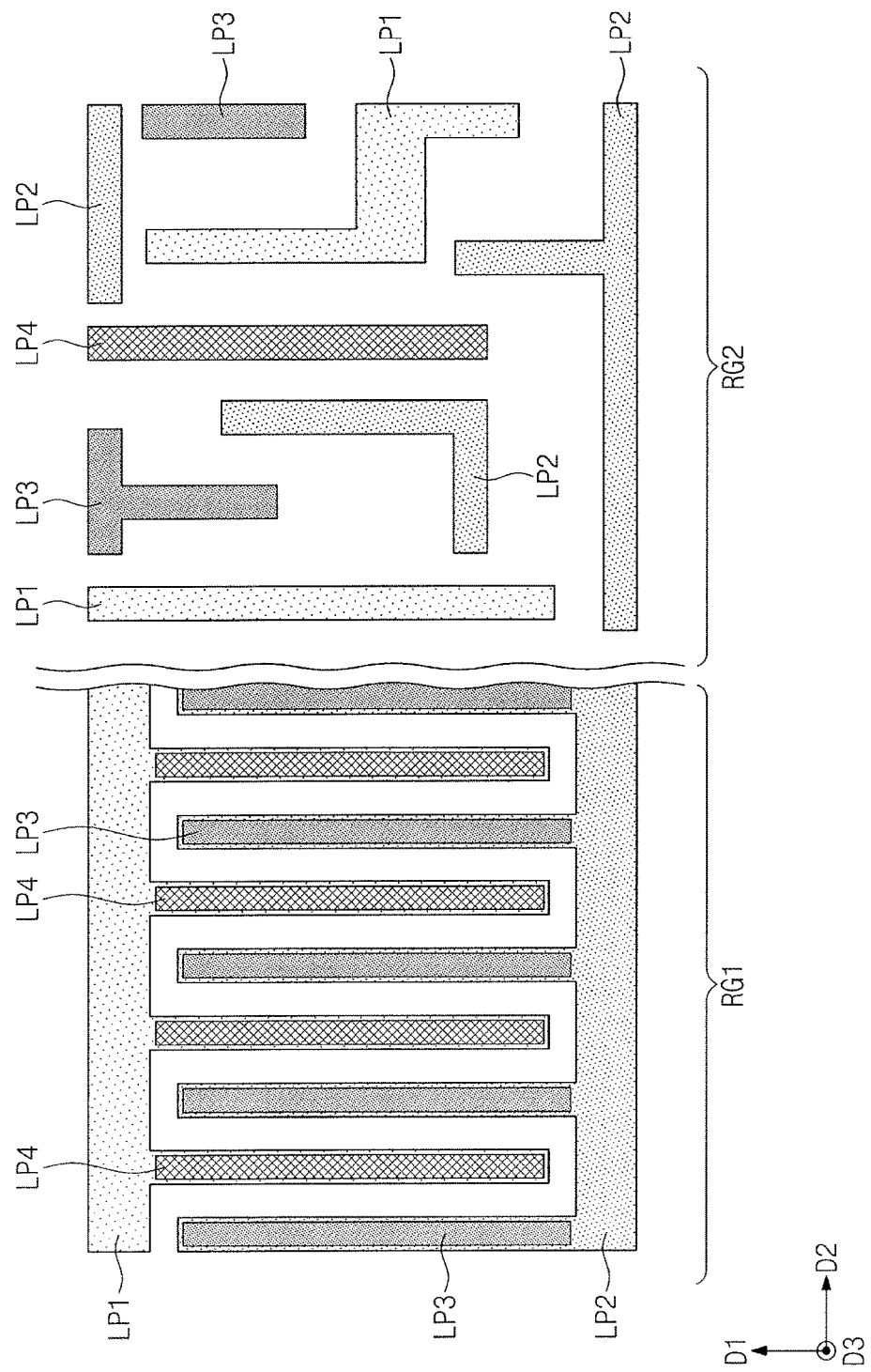
FIG. 17 illustrates a plan view of a layout that is prepared to define a first metal layer of a semiconductor device according to some embodiments.

FIG. 17 is a plan view of a layout that is prepared to define a first metal layer of a semiconductor device according to some embodiments. In the following description, the elements and features similar to those of the layout described with reference to FIG. 6 will not be described in much further detail, for the sake of brevity.

Referring to FIG. 17, layout patterns LP1, LP2, LP3, and LP4 may be provided on the first and second regions RG1 and RG2. Thus, according to the present embodiment, fourth layout patterns LP4 may be provided, in addition to the layout patterns LP1, LP2, and LP3 of FIG. 6. Thus, a fourth photomask may be fabricated, based on the fourth layout patterns LP4. Thus, four different photomasks may be fabricated to realize the layout that is exemplarily shown in FIG. 17.

In the first region RG1, the fourth layout patterns LP4 may be overlapped with the first layout pattern LP1. As an example, the fourth layout patterns LP4 may be completely overlapped with the first layout pattern LP1. According to the present embodiment, the fourth layout patterns LP4 are provided on the first region RG1 to be overlapped with the first layout pattern LP1. Thus, it may be possible to prevent an empty region of the image pattern from being formed in the first region RG1 of the fourth photomask. As a result, it may be possible to increase the uniformity in density of the image patterns provided in the fourth photomask and thereby to prevent adjacent ones of the image patterns, which will be printed on the first region RG1, from being distorted.

FIGS. 18A, 19A, 20A, and 21A are plan views illustrating a method of fabricating a semiconductor device, according to some embodiments. FIGS. 18B, 19B, 20B, and 21B are sectional views taken along lines I-I' and II-II' of FIGS. 18A, 19A, 20A, and 21A, respectively. In the following description, the steps and features similar to those of the method described with reference to FIGS. 8A to 15B will not be described in much further detail, for the sake of brevity.

Figure 18B:
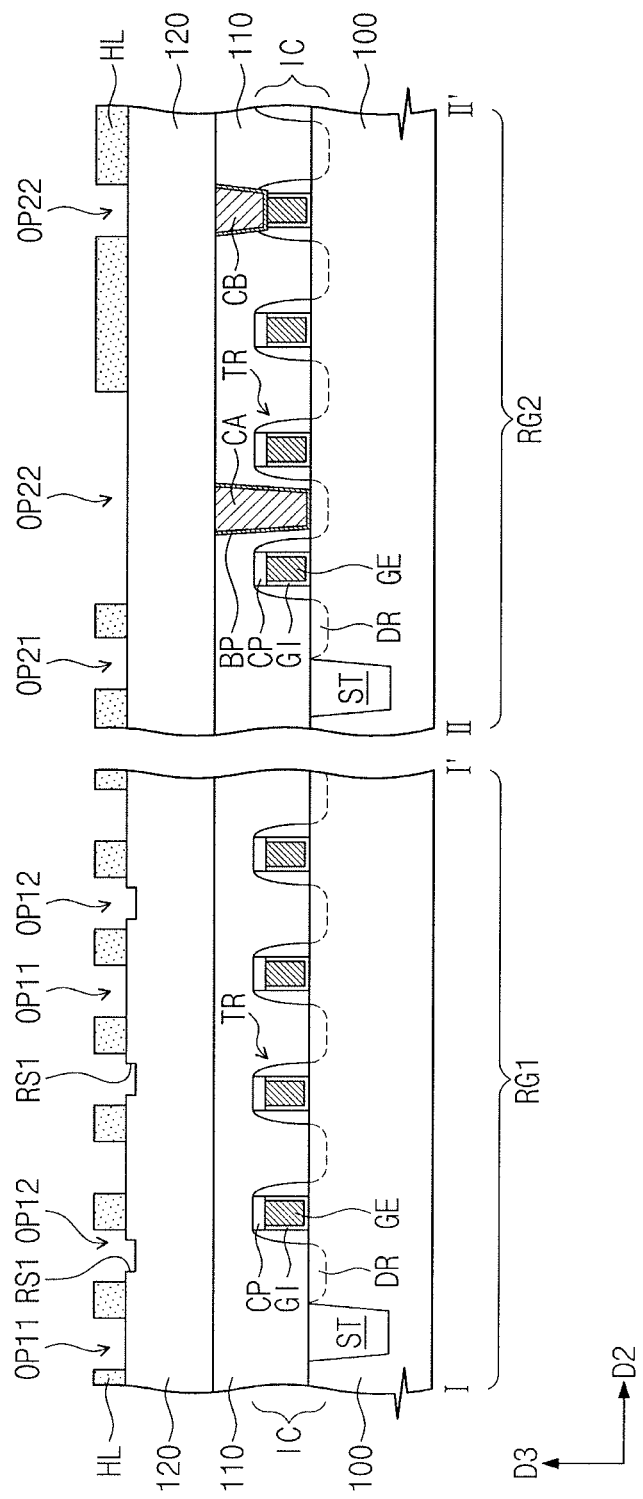
FIGS. 18B, 19B, 20B and 21B illustrate sectional views taken along lines I-I' and II-II' of FIGS. 18A, 19A, 20A and 21A, respectively.

Referring to FIGS. 17, 18A, and 18B, a third patterning process may be performed on the resulting structure of FIGS. 12A and 12B. As a result, the third openings OP23 may be formed in the hard mask layer HL and the first recess regions RS1 may be formed in an upper portion of the second interlayer insulating layer 120. At least one of the third openings OP23 in the second region RG2 shown in FIGS. 13A and 13B may be omitted in the third patterning process and may be formed by a fourth patterning process to be described below.

Figure 19A:
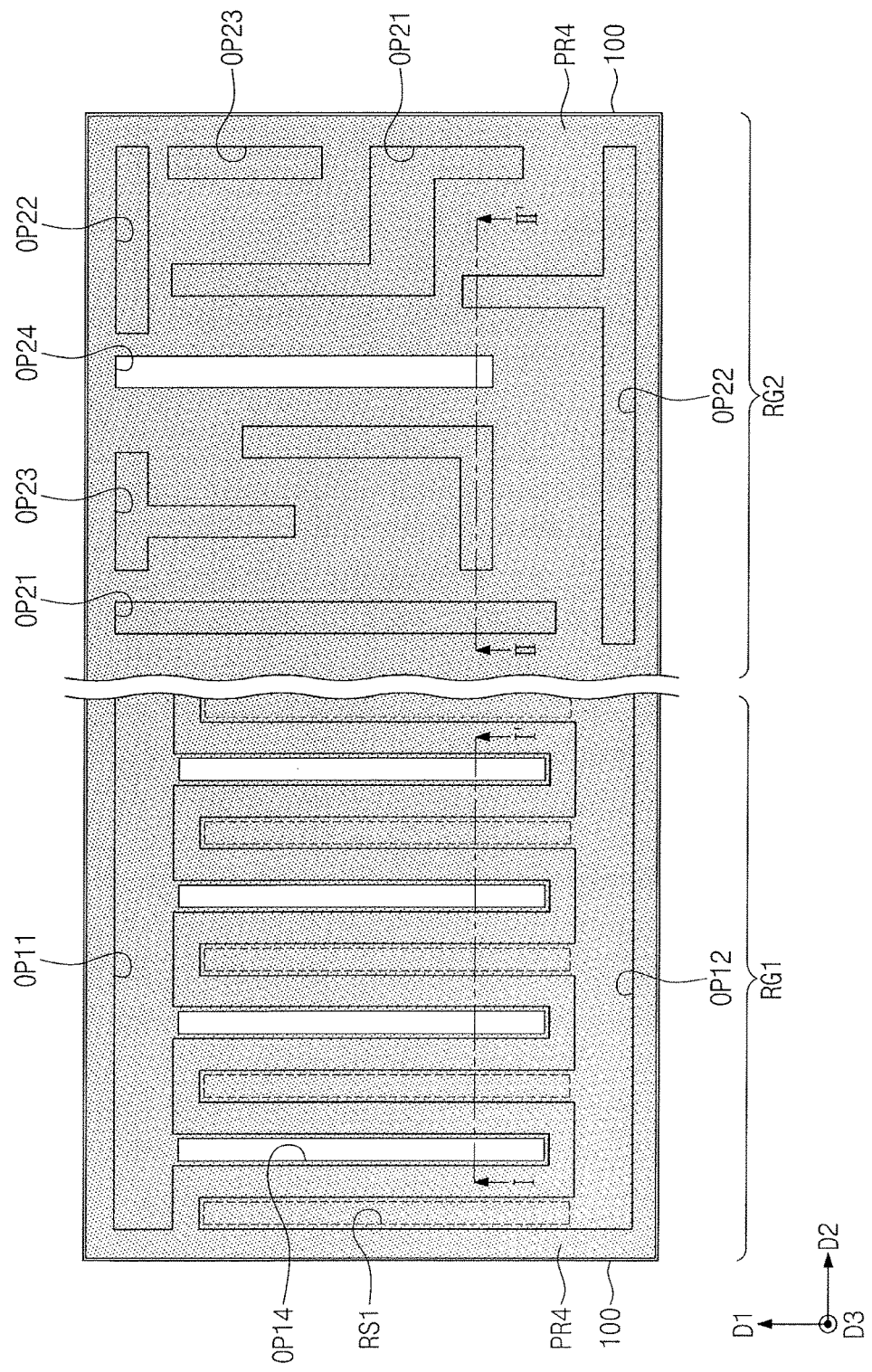
Figure 19B:
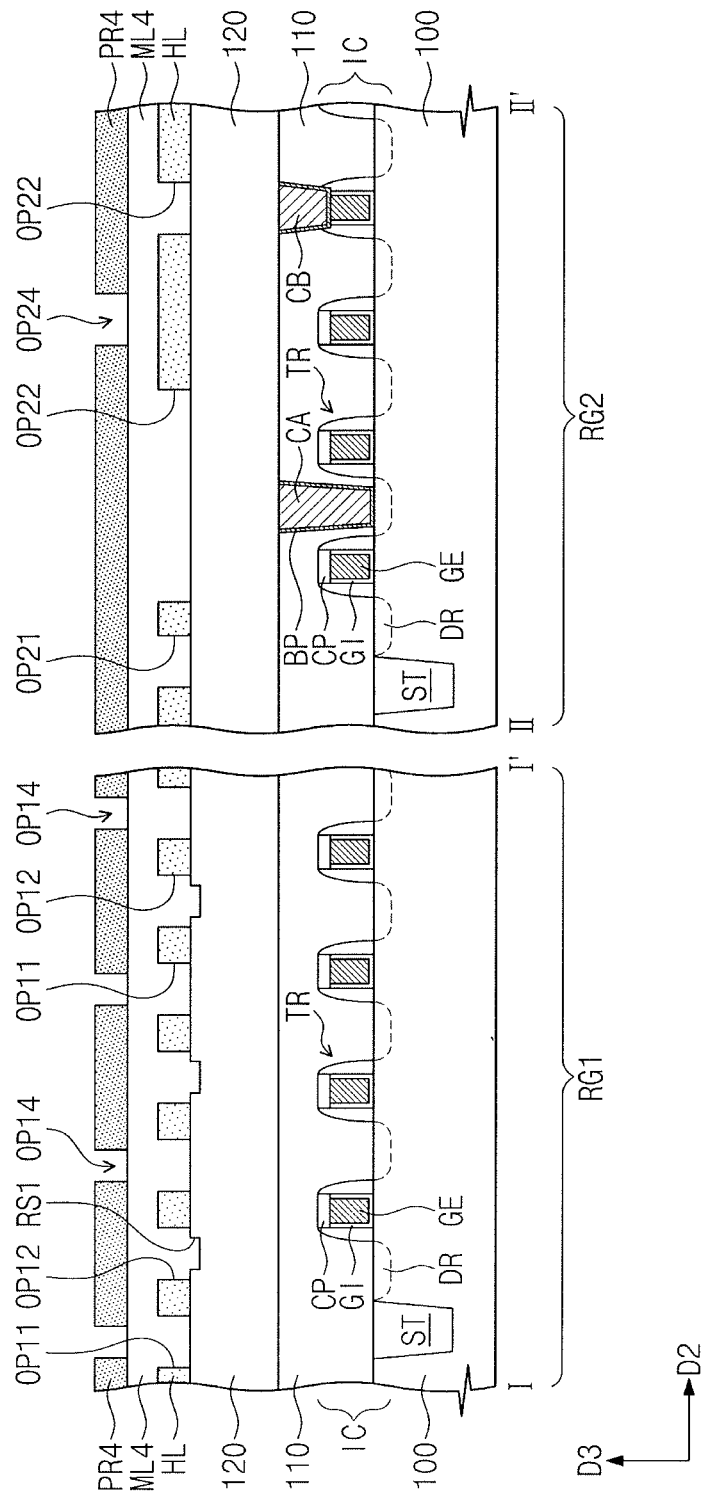

Referring to FIGS. 17, 19A, and 19B, a fourth mold layer ML4 may be formed to cover the hard mask layer HL. The fourth mold layer ML4 may be formed of or include the same material as that of the first mold layer ML1. A fourth photoresist pattern PR4 with fourth openings OP14 and OP24 may be formed on the fourth mold layer ML4. For example, the formation of the fourth photoresist pattern PR4 may include forming a fourth photoresist layer on the fourth mold layer ML4 and performing an exposing and developing process on the fourth photoresist layer using the fourth photomask of FIG. 17. In this case, the fourth openings OP14 on the first region RG1 may be realized by the fourth layout patterns LP4 on the first region RG1, and the fourth opening OP24 in the second region RG2 may be realized by the fourth layout pattern LP4 in the second region RG2.

As described with reference to FIG. 17, the fourth layout patterns LP4 on the first region RG1 may be overlapped with the first layout pattern LP1 on the first region RG1. Thus, the fourth openings OP14 on the first region RG1 may be overlapped with the first opening OP11 of the hard mask layer HL on the first region RG1, when viewed in a plan view.

Figure 20A:
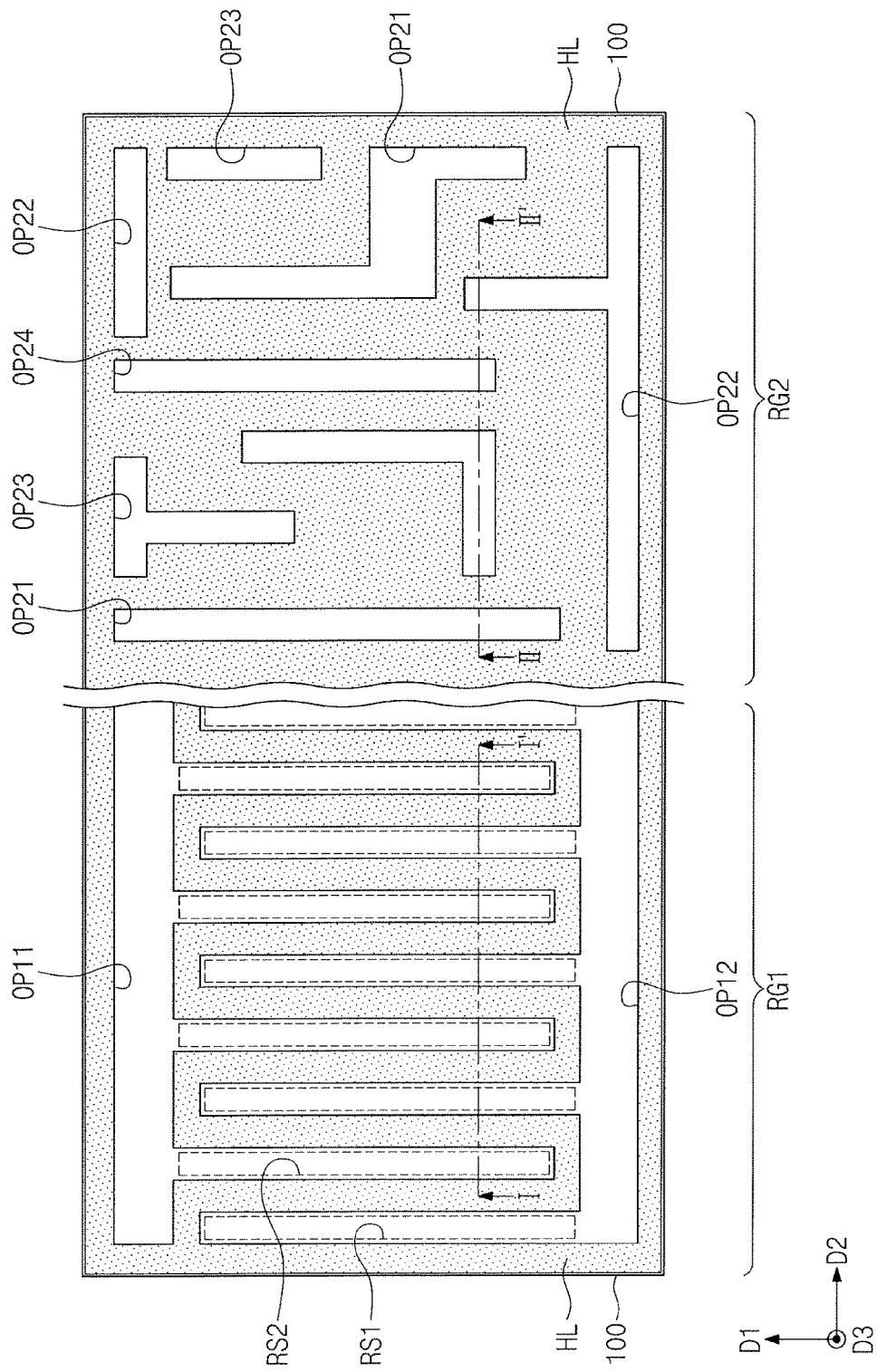
Figure 20B:
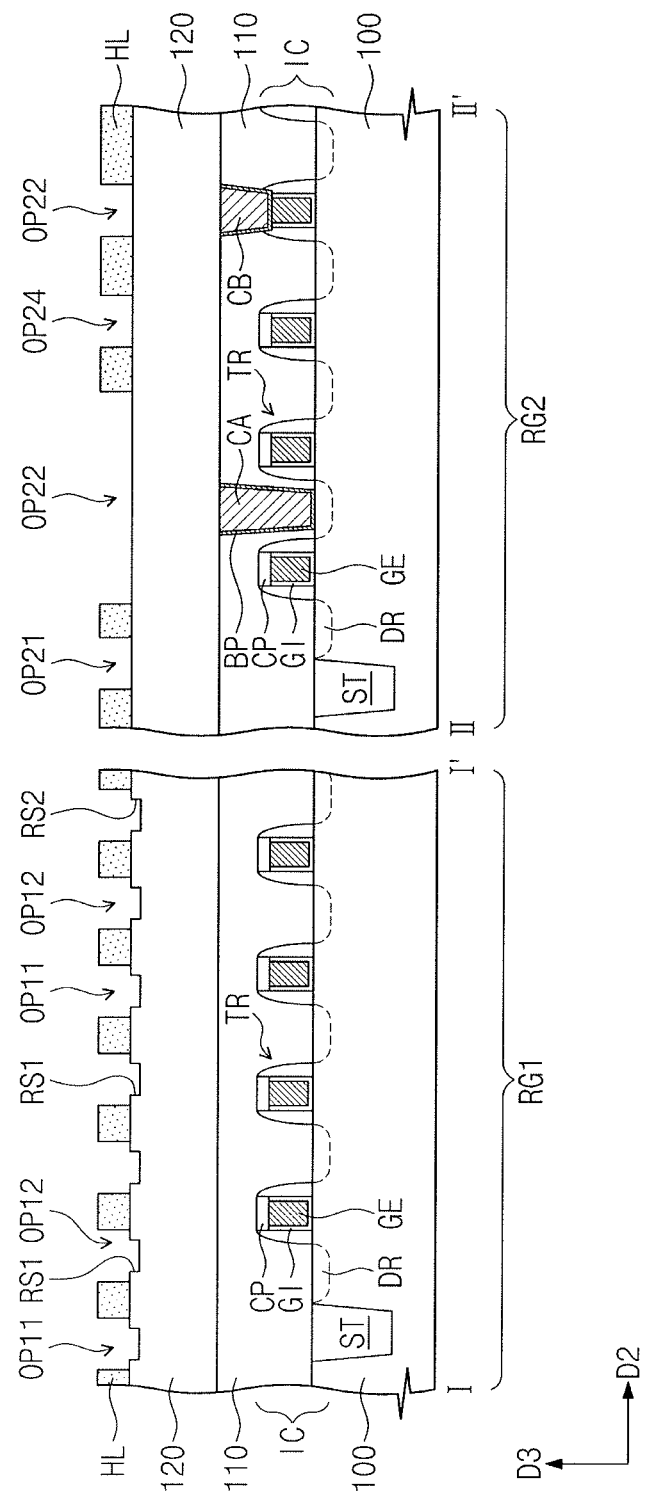

Referring to FIGS. 17, 20A, and 20B, a fourth patterning process using the fourth photoresist pattern PR4 as a mask may be performed to further form the fourth opening OP24 in the hard mask layer HL. For example, the fourth patterning process may include patterning the fourth mold layer ML4 using the fourth photoresist pattern PR4 as a mask and patterning the hard mask layer HL using the patterned fourth mold layer ML4 as a mask. The fourth patterning process may be performed in such a way that the fourth opening OP24 is selectively formed in only the second region RG2. Thus, for the first region RG1, the fourth openings OP14 are overlapped with the first opening OP11. The fourth opening OP24, which is formed by the fourth patterning process, may have substantially the same planar shape as that of the fourth opening OP24 of the fourth photoresist pattern PR4 in the second region RG2 shown in FIG. 19A.

In addition, the fourth patterning process may be performed to form the second recess regions RS2 on the first region RG1. The second recess regions RS2 may be formed in the first opening OP11 on the first region RG1 and in an upper portion of the second interlayer insulating layer 120. For example, the fourth patterning process may include etching a portion of the second interlayer insulating layer 120 that is exposed by the first opening OP11 on the first region RG1. As a result, the second recess regions RS2 with a shallow depth may be formed. The second recess regions RS2, which are formed by the fourth patterning process, may have substantially the same planar shapes as those of the fourth openings OP14 of the fourth photoresist pattern PR4 on the first region RG1 shown in FIG. 19A.

After the fourth patterning process, the remaining portions of the fourth photoresist pattern PR4 and the fourth mold layer ML4 may be removed.

Figure 21A:
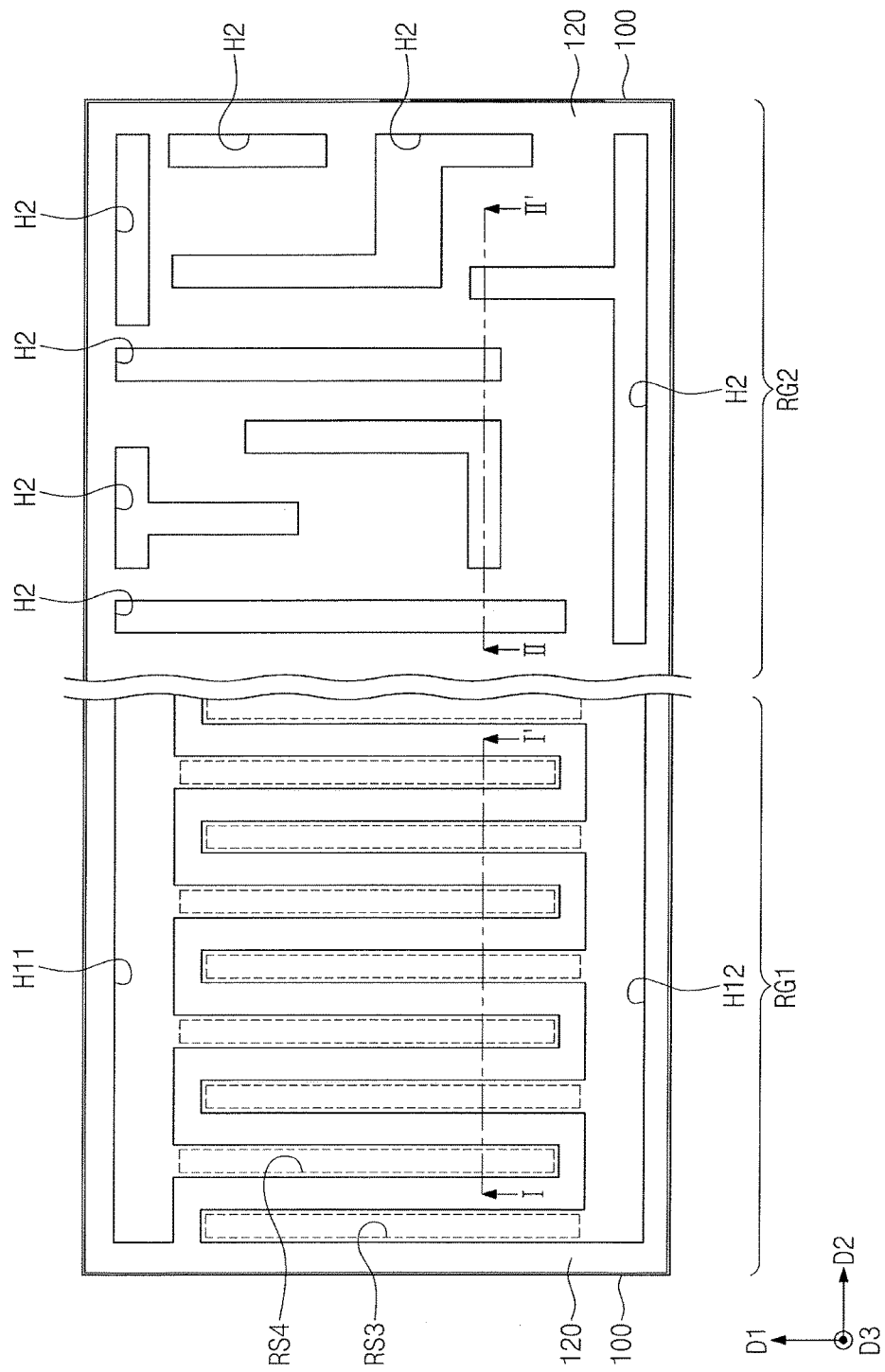
Figure 21B:
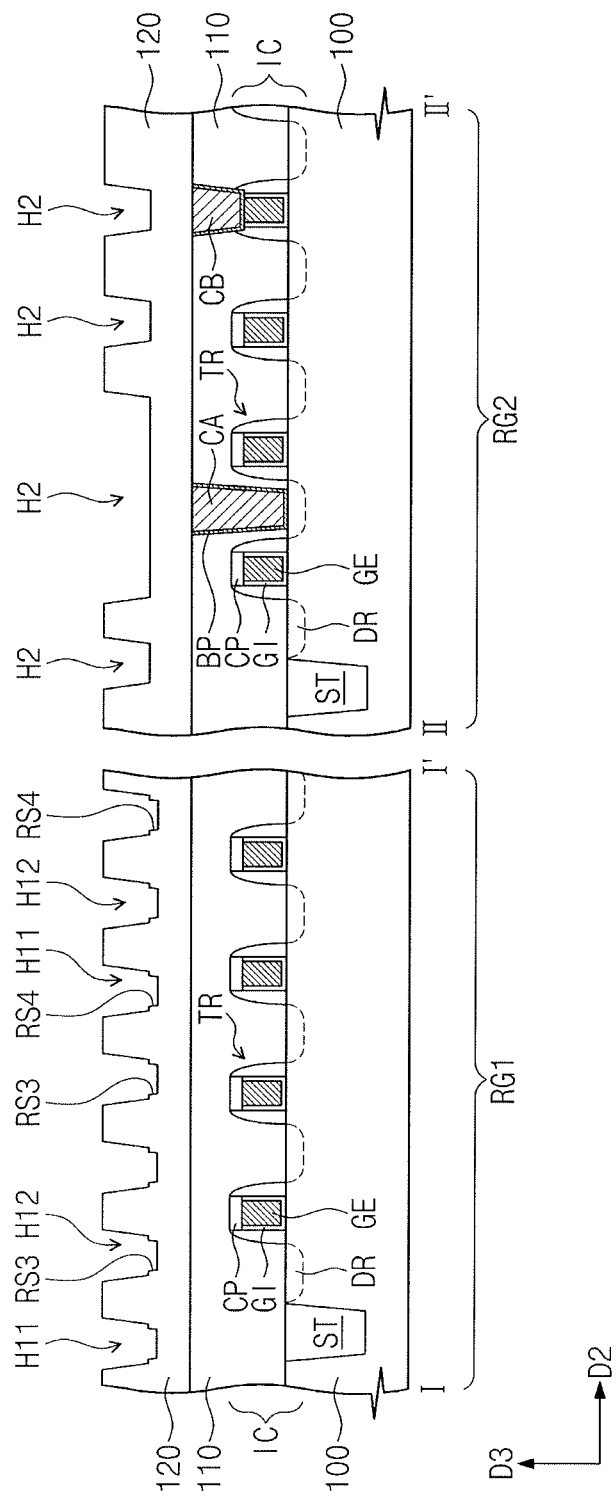

Referring to FIGS. 21A and 21B, an upper portion of the second interlayer insulating layer 120 may be etched using the hard mask layer HL with the first to fourth openings OP11, OP21, OP12, OP22, OP23, and OP24 as an etch mask. As a result, the first wire holes H11 and H12 may be formed in the second interlayer insulating layer 120 on the first region RG1, and the second wire holes H2 may be formed in the second interlayer insulating layer 120 in the second region RG2.

The first wire holes H11 and H12 on the first region RG1 may include the first hole H11 and the second hole H12. The first and second holes H11 and H12 may be respectively formed by the first and second openings OP11 and OP12 on the first region RG1 shown in FIGS. 20A and 20B. The second wire holes H2 in the second region RG2 may be respectively formed by the first to fourth openings OP21, OP22, OP23, and OP24 in the second region RG2 shown in FIGS. 20A and 20B.

Third recess regions RS3 may be formed in the second hole H12 on the first region RG1, and fourth recess regions RS4 may be formed in the first hole H11. For example, when the second hole H12 is formed on the first region RG1, the first recess regions RS1 may be further etched to form the third recess regions RS3. Also, when the first hole H11 is formed on the first region RG1, the second recess regions RS2 may be further etched to form the fourth recess regions RS4. The first and second holes H11 and H12 on the first region RG1 may be formed to have bottom surfaces that are lower than those of the second wire holes H2 in the second region RG2.

Thereafter, the vertical through hole VH may be formed in at least one of the second wire holes H2. The first conductive wiring patterns M11 and M12 may be formed in the first wire holes H11 and H12, and the second conductive wiring patterns M2 may be formed in the second wire holes H2.

As described above, embodiments relate to a semiconductor device including interconnection wires, which are provided on an integrated circuit of a substrate, and a method of fabricating the same According to some embodiments, a plurality of photomasks may be used to fabricate a semiconductor device, and this may make it possible to realize a high density of conductive wiring patterns on a substrate. Here, in each of the photomasks, image patterns may be uniformly disposed on the entire region. Accordingly, it may be possible to improve uniformity of the image pattern density of each photomask. As a result, it may be possible to prevent a process risk such as pattern distortion during an exposing and developing process using the photomask.

Some embodiments may provide a semiconductor device capable of reducing a pattern distortion issue, which may occur in an exposing and developing process, and a method of fabricating the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, comprising:
   forming transistors on a substrate having a first region and a second region;
   sequentially forming an interlayer insulating layer covering the transistors and forming a hard mask layer on the interlayer insulating layer;
   performing a first patterning process on the hard mask layer to form first openings in the first and second regions;
   performing a second patterning process on the hard mask layer to form second openings in the first and second regions;
   performing a third patterning process on the hard mask layer to selectively form at least one third opening in only the second region, wherein the third patterning process includes forming a first photoresist pattern with openings on the hard mask layer, and one of the openings of the first photoresist pattern is overlapped with one of the second openings in the first region, when viewed in a plan view;
   etching the interlayer insulating layer using the hard mask layer as an etch mask to form first to third holes corresponding to respective first to third openings; and
   forming conductive wiring patterns to fill the first to third holes, the conductive wiring patterns including first conductive wiring patterns provided on the first region and in an upper portion of the interlayer insulating layer, and second conductive wiring patterns provided in the second region and in the upper portion of the interlayer insulating layer, wherein:
   the first conductive wiring patterns include a first wire having a protruding portion extending toward the substrate, and
   a level of a bottom surface of the protruding portion is different from a level of a bottom surface of each of the second conductive wiring patterns.

2. The method as claimed in claim 1, wherein each of the first to third patterning processes includes:
   sequentially forming a mold layer and a photoresist layer on the hard mask layer;
   performing an exposing and developing process on the photoresist layer to form a photoresist pattern; and
   sequentially etching the mold layer and the hard mask layer using the photoresist pattern as an etch mask.

3. The method as claimed in claim 1, wherein the third patterning process is performed to further etch the second opening on the first region through the opening of the first photoresist pattern on the first region and thereby to form a recess region in an upper portion of the interlayer insulating layer.

4. The method as claimed in claim 1, further comprising forming a vertically extended conductive portion below at least one of the conductive wiring patterns in the second region.

5. The method as claimed in claim 1, wherein forming the transistors includes:
forming a device isolation layer to define an active region of the substrate; and
forming the transistors on the active region, each of the transistors including a gate electrode and a pair of impurity regions,
wherein the interlayer insulating layer is formed to cover the active region and the transistors.

6. The method as claimed in claim 1, wherein:
the first openings are defined by first layout patterns,
the second openings are defined by second layout patterns,
the openings of the first photoresist pattern are defined by third layout patterns,
the third layout pattern in the second region is spaced apart from the second layout pattern in the second region, and
the third layout pattern on the first region is overlapped with the second layout pattern on the first region.

7. The method as claimed in claim 1, wherein:
the first opening on the first region is formed in plural,
the second opening on the first region is formed in plural,
the first openings and the second openings on the first region extend in a first direction and parallel to each other,
the first openings and the second openings on the first region are alternatingly arranged in a second direction crossing the first direction.

8. A semiconductor device, comprising:
a substrate having a first region and a second region;
transistors provided on the substrate;
an interlayer insulating layer covering the transistors;
first conductive wiring patterns provided on the first region and in an upper portion of the interlayer insulating layer; and
second conductive wiring patterns provided in the second region and in the upper portion of the interlayer insulating layer, wherein:
the first conductive wiring patterns include a first wire having a protruding portion extending toward the substrate, and
a level of a bottom surface of the protruding portion is different from a level of a bottom surface of each of the second conductive wiring patterns.

9. The device as claimed in claim 8, wherein:
the first conductive wiring patterns include a second wire adjacent to the first wire, and
a level of a bottom surface of the second wire is higher than the level of the bottom surface of the protruding portion.

10. The device as claimed in claim 9, wherein:
each of the first wire and the second wire is provided in plural,
the first and second wires extend in a first direction and parallel to each other,
the first and second wires are alternatingly arranged in a second direction crossing the first direction.

11. The device as claimed in claim 8, wherein:
the first conductive wiring patterns include a second wire adjacent to the first wire, and
the second wire includes a protruding portion extending toward the substrate.

12. The device as claimed in claim 11, wherein:
each of the first wire and the second wire is provided in plural,
the first and second wires extend in a first direction and parallel to each other,
the first and second wires are alternatingly arranged in a second direction crossing the first direction.

13. The device as claimed in claim 8, wherein:
an adjacent pair of the first conductive wiring patterns are electrically separated from each other, and
the interlayer insulating layer includes a portion that is interposed between the pair of the first conductive wiring patterns and is used as a dielectric layer of a capacitor.

14. The device as claimed in claim 8, further comprising a contact provided in a lower portion of the interlayer insulating layer in the second region, wherein:
the contact is coupled to an impurity region of one of the transistors or a gate electrode of one of the transistors,
at least one of the second conductive wiring patterns includes a vertically extended portion that extends toward the substrate and is coupled to the contact, and
the level of a bottom surface of the protruding portion is higher than a level of a bottom surface of the vertically extended portion.

15. A semiconductor device, comprising:
a substrate having a first region and a second region;
transistors provided on the substrate in the first and second regions;
an interlayer insulating layer covering the transistors in the first and second regions;
first conductive wiring patterns provided in the first region in an upper portion of the interlayer insulating layer; and
second conductive wiring patterns provided in the second region in the upper portion of the interlayer insulating layer, wherein:
the first conductive wiring patterns include a first wire having a bottom portion and a protruding portion that extends from the bottom portion toward the substrate, and
the second conductive wiring patterns include a first wiring pattern having a bottom portion that is level with the bottom portion of the first wire.

16. The device as claimed in claim 15, wherein:
the first wiring pattern includes a vertically extended portion that extends from the bottom portion of the first wiring pattern toward the substrate and is coupled to a contact, and
a lowermost part of the protruding portion of the first wire is farther from the substrate than a lowermost part of the vertically extended portion.

17. The device as claimed in claim 15, wherein the first wire has a cross-section having a step where the protruding portion meets the bottom portion.

18. The device as claimed in claim 15, wherein the second conductive wiring patterns are not provided with the protruding portion.

19. The device as claimed in claim 15, wherein the first conductive wiring patterns include a second wire having a bottom portion and a protruding portion, the bottom portions of the first and second wires being level with one another, and a lowermost part of the protruding portion of the first wire being level with a lowermost part of the protruding portion of the second wire, the first and second wires being separated from one another and forming a capacitor therebetween.

* * * * *